(12) United States Patent
Yamazaki et al.

(10) Patent No.: US 10,862,193 B2
(45) Date of Patent: Dec. 8, 2020

(54) SEMICONDUCTOR DEVICE AND ELECTRONIC DEVICE INCLUDING THE SAME

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/671,233

(22) Filed: Nov. 1, 2019

(65) Prior Publication Data

US 2020/0067175 A1 Feb. 27, 2020

Related U.S. Application Data

(63) Continuation of application No. 15/887,101, filed on Feb. 2, 2018, now Pat. No. 10,468,748, which is a
(Continued)

(30) Foreign Application Priority Data

Jan. 29, 2010 (JP) ................... 2010-019602

(51) Int. Cl.
*H01Q 1/24* (2006.01)
*H01Q 25/00* (2006.01)
(Continued)

(52) U.S. Cl.
CPC ............ *H01Q 1/24* (2013.01); *H01Q 1/2258* (2013.01); *H01Q 1/38* (2013.01); *H01Q 7/00* (2013.01);
(Continued)

(58) Field of Classification Search
CPC .......... H01Q 1/24; H01Q 1/2258; H01Q 1/38; H01Q 25/005; H01Q 7/00; G06K 19/07; G06K 19/077
See application file for complete search history.

(56) References Cited

U.S. PATENT DOCUMENTS

| | | |
|---|---|---|
| 5,530,568 A | 6/1996 | Yamamoto et al. |
| 5,731,856 A | 3/1998 | Kim et al. |

(Continued)

FOREIGN PATENT DOCUMENTS

| | | |
|---|---|---|
| CN | 001722521 A | 1/2006 |
| CN | 101572337 A | 11/2009 |

(Continued)

OTHER PUBLICATIONS

International Search Report (Application No. PCT/JP2011/050599) dated May 10, 2011.
(Continued)

*Primary Examiner* — Sardis F Azongha
(74) *Attorney, Agent, or Firm* — Fish & Richardson P.C.

(57) ABSTRACT

A semiconductor device capable of inputting signals and power without the use of an FPC is provided. The semiconductor device includes a first substrate and a second substrate. A receiver antenna is provided on a surface side of the first substrate. The second substrate is provided with a transmitter antenna and an integrated circuit. The second substrate is attached on a back side of the first substrate. The receiver antenna and the transmitter antenna overlap with each other with the first substrate provided therebetween. Thus, the distance between the antennas can be kept constant, so that signals and power can be received highly efficiently.

21 Claims, 16 Drawing Sheets

Related U.S. Application Data continuation of application No. 13/015,233, filed on Jan. 27, 2011, now Pat. No. 9,887,450.

(51) Int. Cl.
| | | |
|---|---|---|
| *H01Q 7/00* | (2006.01) | |
| *H01Q 1/38* | (2006.01) | |
| *H01Q 1/22* | (2006.01) | |
| *G02F 1/1345* | (2006.01) | |
| *H01L 27/12* | (2006.01) | |

(52) U.S. Cl.
CPC ....... *H01Q 25/005* (2013.01); *G02F 1/13452* (2013.01); *H01L 27/1225* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,799,721 B2 | 10/2004 | Parrault |
| 6,885,146 B2 | 4/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,180,403 B2 | 2/2007 | Quan |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,862 B2 | 10/2008 | Quan |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,492,361 B2 | 2/2009 | Kawachi et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,804,091 B2 | 9/2010 | Takechi et al. |
| 7,834,843 B2 | 11/2010 | Karaki |
| 7,932,589 B2 | 4/2011 | Yamazaki et al. |
| 7,960,916 B2 | 6/2011 | Kawachi |
| 7,977,675 B2 | 7/2011 | Kawamura et al. |
| 8,121,544 B2 | 2/2012 | Shimizu et al. |
| 8,154,509 B2 | 4/2012 | Karaki |
| 8,193,045 B2 | 6/2012 | Omura et al. |
| 8,199,267 B2 | 6/2012 | Kimura |
| 8,232,124 B2 | 7/2012 | Takechi et al. |
| 8,674,808 B2 | 3/2014 | Jantunen et al. |
| 8,872,331 B2 | 10/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0057422 A1 | 3/2005 | Deguchi et al. |
| 2005/0199959 A1 | 9/2005 | Chiang et al. |
| 2005/0258940 A1 | 11/2005 | Quan |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0209060 A1 | 9/2006 | Tanada et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0176845 A1* | 8/2007 | Yamazaki ........ G06K 19/07728 343/895 |
| 2007/0182727 A1 | 8/2007 | Kobayashi et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0268207 A1 | 11/2007 | Karaki |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055303 A1 | 3/2008 | Ikeda |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158217 A1 | 7/2008 | Hata et al. |
| 2008/0166834 A1 | 7/2008 | Kim et al. |
| 2008/0182358 A1 | 7/2008 | Cowdery-Corvan et al. |
| 2008/0191959 A1 | 8/2008 | Koyama et al. |
| 2008/0211800 A1 | 9/2008 | Arasawa et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002586 A1 | 1/2009 | Kimura |
| 2009/0027166 A1 | 1/2009 | Stevens et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0115754 A1 | 5/2009 | Kawachi et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153445 A1 | 6/2009 | Furuta et al. |
| 2009/0184950 A1 | 7/2009 | Furuta et al. |
| 2009/0273418 A1 | 11/2009 | Shimizu et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0321325 A1 | 12/2010 | Springer et al. |
| 2010/0328043 A1 | 12/2010 | Jantunen et al. |
| 2015/0014419 A1 | 1/2015 | Yamazaki et al. |

FOREIGN PATENT DOCUMENTS

| | | |
|---|---|---|
| EP | 1605391 A | 12/2005 |
| EP | 1605392 A | 12/2005 |

(56) References Cited

FOREIGN PATENT DOCUMENTS

| | | |
|---|---|---|
| EP | 1624439 A | 2/2006 |
| EP | 1737044 A | 12/2006 |
| EP | 1870980 A | 12/2007 |
| EP | 1870981 A | 12/2007 |
| EP | 1939842 A | 7/2008 |
| EP | 2019425 A | 1/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-167264 A | 6/2003 |
| JP | 2003-216111 A | 7/2003 |
| JP | 2004-103957 A | 4/2004 |
| JP | 2004-163685 A | 6/2004 |
| JP | 2004-273614 A | 9/2004 |
| JP | 2004-273732 A | 9/2004 |
| JP | 2004-280193 A | 10/2004 |
| JP | 2004-328605 A | 11/2004 |
| JP | 2005-301219 A | 10/2005 |
| JP | 2006-012129 A | 1/2006 |
| JP | 2006-018132 A | 1/2006 |
| JP | 2006-078993 A | 3/2006 |
| JP | 2007-212709 A | 8/2007 |
| JP | 2008-040343 A | 2/2008 |
| JP | 2008-083679 A | 4/2008 |
| JP | 4129793 | 5/2008 |
| JP | 2008-140398 A | 6/2008 |
| JP | 2008-181108 A | 8/2008 |
| JP | 2008-197714 A | 8/2008 |
| JP | 2008-233727 A | 10/2008 |
| JP | 2008-310298 A | 12/2008 |
| JP | 2009-010362 A | 1/2009 |
| JP | 2009-146088 A | 7/2009 |
| JP | 2009-169327 A | 7/2009 |
| JP | 2009-169992 A | 7/2009 |
| JP | 2009-260002 A | 11/2009 |
| KR | 2007-0112353 A | 11/2007 |
| TW | 200924154 | 6/2009 |
| WO | WO-2004/114391 | 12/2004 |
| WO | WO-2008/149873 | 12/2008 |
| WO | WO-2009/106672 | 9/2009 |

OTHER PUBLICATIONS

Written Opinion (Application No. PCT/JP2011/050599) dated May 10, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO2(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID

(56) References Cited

OTHER PUBLICATIONS

Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The Blue Phase", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW'09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW'06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn]at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of The Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201180005414.8) dated Jun. 17, 2014.

Taiwanese Office Action (Application No. 100102857) dated Sep. 11, 2015.

Korean Office Action (Application No. 2012-7021573) dated Dec. 19, 2016.

\* cited by examiner

SEMICONDUCTOR DEVICE AND ELECTRONIC DEVICE INCLUDING THE SAME

CROSS-REFERENCE TO RELATED APPLICATIONS

This application is a continuation of U.S. application Ser. No. 15/887,101, filed Feb. 2, 2018, now allowed, which is a continuation of U.S. application Ser. No. 13/015,233, filed Jan. 27, 2011, now U.S. Pat. No. 9,887,450, which claims the benefit of a foreign priority application filed in Japan as Serial No. 2010-019602 on Jan. 29, 2010, all of which are incorporated by reference.

TECHNICAL FIELD

The present invention relates to semiconductor devices and electronic devices including the semiconductor devices. In particular, the present invention relates to displays and electronic devices including the displays.

BACKGROUND ART

In recent years, flat panel displays have been widely used. Flat panel displays are used in a variety of devices such as liquid crystal televisions, personal computers, cellular phones, digital cameras, personal digital assistants, and portable audio equipment. Displays including liquid crystals, OLEDs, electrophoretic elements, and the like are widely used. An active-matrix display where transistors are arranged in matrix in a pixel portion is presently pervasive.

FIG. 10 is the external view of a substrate used in a conventional display. A substrate 901 used in the conventional display includes a pixel portion 902, a signal line driver circuit (also referred to as a source driver) 904, and a scan line driver circuit (also referred to as a gate driver) 903. In addition, signals and power needed in the scan line driver circuit 903 and the signal line driver circuit 904 are input from the outside through a flexible printed circuit (FPC) 905 (for example, see Reference 1). Here, for the scan line driver circuit 903 and the signal line driver circuit 904, transistors provided over the substrate that are similar to transistors in the pixel portion may be used, or an IC chip may be attached to the substrate by chip on glass (COG).

REFERENCE

[Reference 1] Japanese Published Patent Application No. 2008-233727

DISCLOSURE OF INVENTION

Connection with the use of the FPC is as follows. The FPC 905 and a wiring provided over a glass substrate or a flexible substrate such as a plastic substrate are bonded to each other with a conductive resin. The size of a plurality of terminals of the FPC is about 100 μm×1 mm each, and the contact area is not very large. Thus, the connection strength of a portion where the wiring provided over the substrate and an FPC terminal are bonded to each other is not very high, so that disconnection might occur when vibration is caused or the temperature is changed. In particular, when a flexible substrate is used, the substrate is bent; thus, the wiring and the FPC terminal are disconnected to each other due to vibration, and contact failure might occur. In that case, signals and power needed in the display do not spread, which leads to the malfunction of the display in some cases. In particular, the number of signal lines is large; thus, the signal lines have high possibility of malfunctions in connection portions. Therefore, a method for inputting signals and power to the display without the use of an FPC has been demanded.

In view of the foregoing problems, it is an object to provide a novel display capable of inputting signals and power without the use of an FPC. Without limitation to the display, it is an object to provide a novel semiconductor device capable of inputting signals and power without the use of an FPC.

One embodiment of the present invention is a semiconductor device capable of inputting signals and power wirelessly without the use of an FPC. Specifically, the semiconductor device includes a first substrate and a second substrate. A first signal antenna and a first power antenna are provided on a surface side of the first substrate. The second substrate is provided with a second signal antenna and a second power antenna. The second substrate is attached on a back side of the first substrate. The first signal antenna and the second signal antenna overlap with each other with the first substrate provided therebetween to be fixed to each other. The first power antenna and the second power antenna overlap with each other with the first substrate provided therebetween to be fixed to each other. The first signal antenna and the first power antenna are receiver antennas. The second signal antenna and the second power antenna are transmitter antennas.

In the semiconductor device, the first signal antenna and the first power antenna are provided separately. However, without separate provision of the antennas, one antenna can serve as a signal antenna and a power antenna. In that case, one first antenna which serves as a signal antenna and a power antenna is provided over the first substrate, and one second antenna which serves as a signal antenna and a power antenna is provided over the second substrate. The structures of the other components can be similar to those described above. In other words, the second substrate is attached on the back side of the first substrate, and the first antenna and the second antenna overlap with each other with the first substrate provided therebetween to be fixed to each other. The first antenna is a receiver antenna, and the second antenna is a transmitter antenna.

The number of signal lines is large; thus, in the case where the signal lines are directly connected, the number of connection portions is large. Thus, at least in a signal processing portion, signals are transmitted and received wirelessly (without contact). Accordingly, the problem of bad connection in an FPC terminal portion can be solved.

Further, the number of power lines is small. For example, the number of power lines per substrate can be two. Since the number of power lines is small in this manner, in a power source portion, a wiring provided over the first substrate can be directly connected to a wiring provided over the second substrate or a different substrate. In that case, the power lines can be connected to an external terminal with the use of an FPC or the like. Accordingly, it is possible not to provide the first power antenna and the second power antenna in the semiconductor device.

In the semiconductor device, plural first signal receiver antennas and the plural second signal transmitter antennas can be provided. When plural sets of signal antennas (signal receiver antennas and signal transmitter antennas) are provided in this manner, the transmitting and receiving speed of signals can be improved. In one embodiment of the present invention, the problem of bad connection in a portion connected to the outside is less likely to be caused as compared to the case where an FPC or the like is used. Accordingly, a structure where the number of signal input/output portions (i.e., signal receiver antennas and signal transmitter antennas) is increased can be easily employed.

In the semiconductor device, the first substrate and the second substrate can be attached to each other with an adhesive or the like. In addition, a material into which an insulating filler is mixed may be used as an adhesive. When a material into which an insulating filler is mixed is used as the adhesive, the thickness of the attachment portion (i.e., bond portion) can be made more uniform.

A region where the first substrate and the second substrate are attached to each other can be a region including a region where the antennas are provided over the first substrate and the second substrate. Therefore, the area of the region where the first substrate and the second substrate are attached to each other can be the same as or larger than the area of the antennas. The antennas have a certain size. Thus, the attachment portion has a certain size. Accordingly, the bond strength of the attachment portion can be made high.

In the semiconductor device, a flexible substrate can be used as the first substrate. Even when the substrate (the flexible substrate) is bent, in one embodiment of the present invention, the distance between the antennas can be kept constant, so that signals and power can be received highly efficiently. In this manner, a semiconductor device according to one embodiment of the present invention can have various structures when the substrate is bent. Any substrate can be used as long as it has a certain thickness and includes a material which transmits an electromagnetic wave with frequency used for transmission and reception of signals and power. An insulating material can be used as a material which transmits an electromagnetic wave with frequency used for transmission and reception of signals and power. In addition, a flexible substrate can be used as the second substrate attached to the first substrate. When a flexible substrate is used as the second substrate, in the case where the first substrate is bent, the second substrate is bent similarly. Therefore, even in the case where the substrate is bent, the distance between the antennas can be kept constant.

In the semiconductor device, a thin-plate or film-like substrate with a thickness of 0.1 to 3.0 mm can be used as the first substrate. Here, a thin flexible substrate is referred to as a film-like substrate. When a thin-plate or film-like substrate is used, signals and power can be received highly efficiently. Further, a phenomenon that communication failure occurs only when the transmitter antenna and the receiver antenna are placed in a certain distance, i.e., a dropout phenomenon can be prevented. This is because the distance between the two antennas provided on the surface side and the back side of the first substrate is determined mainly by the thickness of the first substrate. In the case where the thickness of the first substrate exceeds the above range, the dropout phenomenon might occur. However, the thickness of the first substrate is not necessarily limited to the above range. The first substrate can have any thickness as long as signals and power can be transmitted and received and the dropout phenomenon does not occur.

In the semiconductor device, the first substrate can have a pixel portion including a plurality of pixels. Each of the plurality of pixels can have a transistor and a display element.

In the semiconductor device, the first substrate can have a pixel portion including a plurality of pixels, a scan line driver circuit, and a signal line driver circuit. Each of the plurality of pixels can have a transistor whose on/off is controlled by the scan line driver circuit (such a transistor is also referred to as a switching transistor) and a display element to which an image signal is input from the signal line driver circuit through the transistor.

In the semiconductor device, a liquid crystal element, a light-emitting element, or an electrophoretic element can be used as the display element. When an electrophoretic element is used, power consumption can be reduced. Alternatively, in the case where a liquid crystal element is used, a reflective liquid crystal element is preferably used. A reflective liquid crystal element can be obtained by formation of a reflective electrode as a pixel electrode. Thus, power consumed by a backlight can be reduced, so that the power consumption of the semiconductor device can be reduced.

In the semiconductor device, a channel formation region of the transistor can have an oxide semiconductor layer. A transistor including an oxide semiconductor has an electrical characteristic of much lower off-state current than a transistor including silicon or the like. Therefore, when a transistor including an oxide semiconductor is used as the switching transistor in the pixel, an image signal written to the display element can be held for a long period without a change in the circuit structure or the like of the pixel. Accordingly, in the case where still images or the like is displayed, write frequency can be lowered. Thus, power consumption can be reduced.

In one embodiment of the present invention, signals are transmitted and received wirelessly (without contact). Therefore, a technique by which a transistor including an oxide semiconductor is used as a switching transistor in a pixel and write frequency and transmitting and receiving speed of signals can be lowered as described above is very useful in one embodiment of the present invention. With the transistor, an image signal written to a display element can be held for a long period. Accordingly, even in the case where write frequency is low, degradation (change) in display of the pixel can be suppressed.

In one embodiment of the present invention, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between antennas can be kept constant, so that signals and power can be received highly efficiently.

Furthermore, even in the case where a flexible substrate is used as a substrate, the distance between antennas can be kept constant, so that signals and power can be received highly efficiently. Therefore, a semiconductor device can have various structures when the substrate is bent.

Moreover, when a transistor including an oxide semiconductor is used as a switching transistor included in a pixel portion, an image signal written to a display element can be held for a long period. Therefore, even in the case where signals and power are supplied wirelessly, high-quality images can be displayed.

BEST MODE FOR CARRYING OUT THE INVENTION

Figure 1:
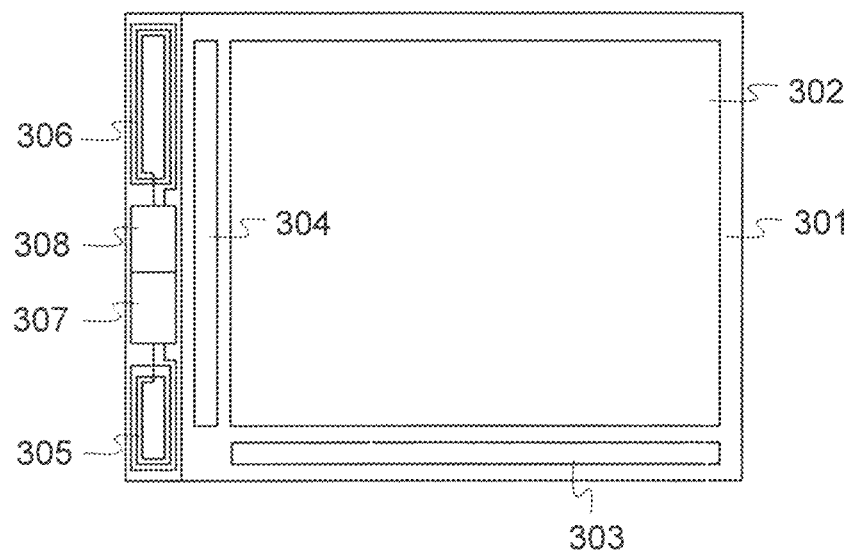
FIG. 1 is an example of a top view of a semiconductor device.

Embodiments and examples of the present invention will be described below with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments and examples. Note that in the description of the structure of the present invention with reference to the drawings, reference numerals denoting the same components are used in common in different drawings.

Embodiment 1

In this embodiment, an example of a semiconductor device which is one embodiment of the disclosed invention is described with reference to FIG. 1 and FIGS. 2A to 2E. In this embodiment, an example in which a semiconductor device is a display is described.

FIG. 1 is an example of the top view of a substrate 301 included in the semiconductor device described in this embodiment. The substrate 301 is provided with a signal antenna 305 and a power antenna 306. The signal antenna 305 and the power antenna 306 are used as receiver antennas. In addition, a signal processing portion 307 and a power source portion 308 are provided so as to be electrically connected to the antennas.

The semiconductor device described in this embodiment is a display, which includes a pixel portion 302 on the substrate 301. The pixel portion 302 includes a plurality of pixels. Further, in order to drive the plurality of pixels included in the pixel portion 302, a scan line driver circuit 303 and a signal line driver circuit 304 are provided. Note that a side on which the antennas and the like are provided is referred to as a surface side of the substrate.

FIGS. 2A to 2E are examples of top views and cross-sectional views of the substrate 301 and a substrate 601 included in the semiconductor device described in this embodiment.

Figure 2A:
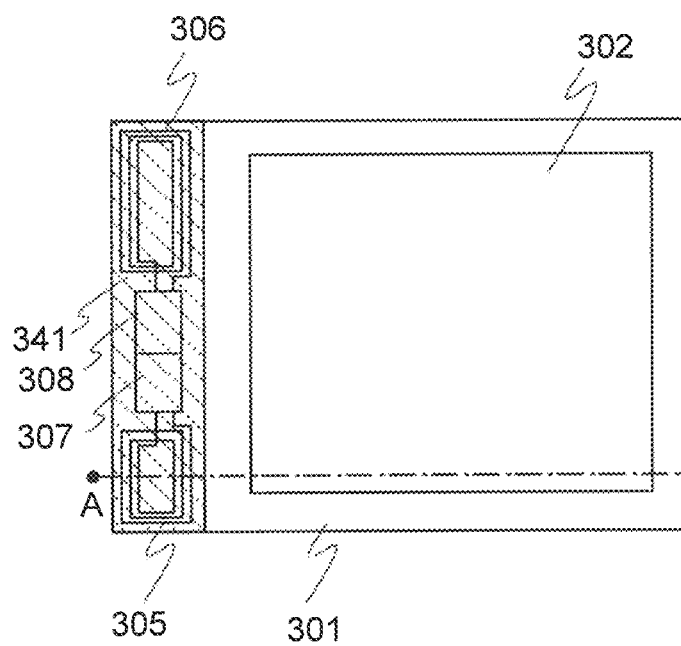
FIGS. 2A and 2B are examples of top views of a semiconductor device.

FIG. 2A is an example of the top view of the substrate 301. The structure in FIG. 2A is substantially the same as the structure in FIG. 1. That is, the substrate 301 is provided with the signal antenna 305 and the power antenna 306. The signal antenna 305 and the power antenna 306 are used as receiver antennas. In addition, the signal processing portion 307 and the power source portion 308 are provided so as to be electrically connected to the antennas. Further, the substrate 301 is provided with the pixel portion 302. Although FIG. 2A does not illustrate a scan line driver circuit and a signal line driver circuit, the semiconductor device illustrated in FIG. 2A can include a scan line driver circuit and a signal line driver circuit as in FIG. 1.

Figure 2B:
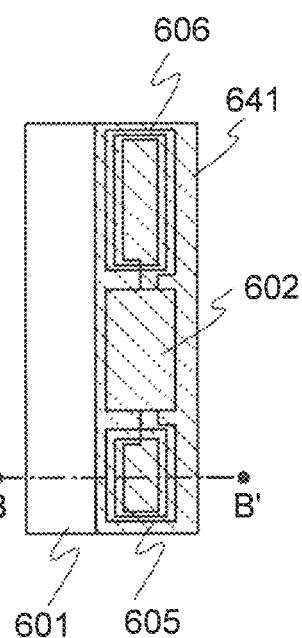

FIG. 2B is an example of the top view of the substrate 601. The substrate 601 is provided with a signal antenna 605 and a power antenna 606. The signal antenna 605 and the power antenna 606 are used as transmitter antennas. In addition, an integrated circuit 602 is provided so as to be electrically connected to the antennas. Further, signals and power needed in the integrated circuit 602 are input from the outside. Signals and power needed in the integrated circuit 602 can be supplied wirelessly. In that case, in addition to the signal antenna 605 and the power antenna 606, another antenna may be provided. Alternatively, signals and power needed in the integrated circuit 602 can be input from the outside through an FPC or the like.

Figure 2C:
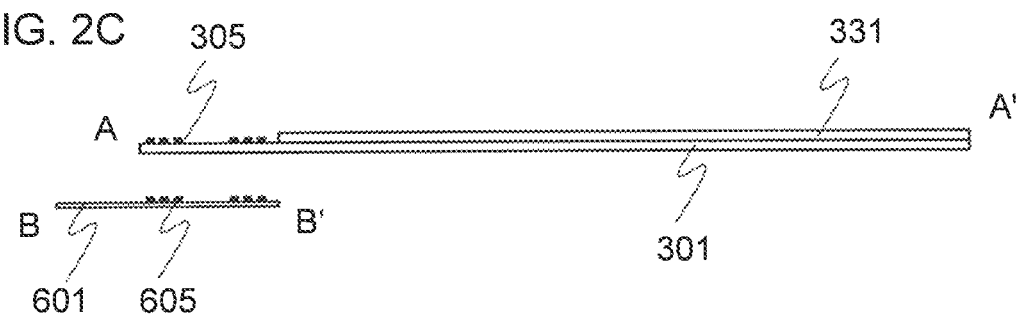
FIGS. 2C to 2E are examples of cross-sectional views of the semiconductor device.
Figure 2D:
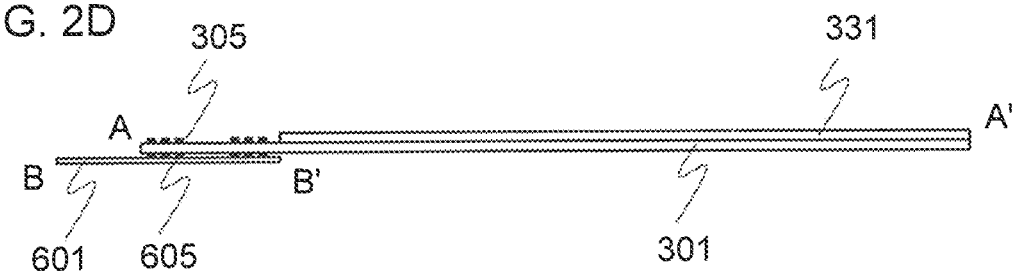
Figure 2E:
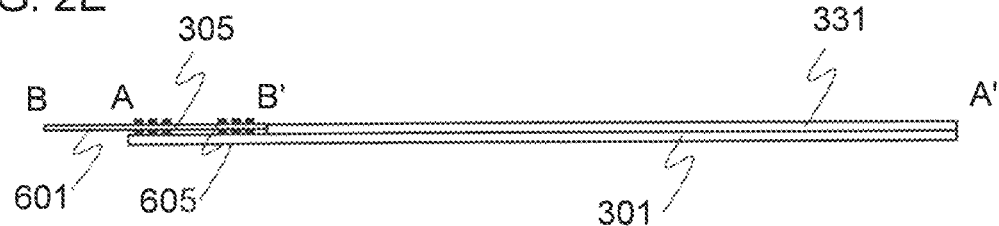

FIG. 2C illustrates an A-A' cross section of the substrate 301 in FIG. 2A. FIG. 2D illustrates a B-B' cross section of the substrate 601 in FIG. 2B. FIG. 2C is an example of a cross-sectional view of the substrate 301 and the substrate 601 before being attached to each other. FIGS. 2D and 2E are examples of a cross-sectional view of the substrate 301 and the substrate 601 after being attached to each other.

As illustrated in FIG. 2C, the signal antenna 305 is provided in the A-A' cross section of the substrate 301. In addition, a substrate 331 is provided over the pixel portion 302 of the substrate 301. The substrate 331 is used as a substrate provided with a counter electrode facing a pixel electrode, a substrate which protects the pixel portion 302, or a substrate which seals the pixel portion 302. The signal antenna 605 is provided in the B-B' cross section of the substrate 601.

FIG. 2D is the example of the cross-sectional view of the substrate 301 and the substrate 601 after being attached to each other. As illustrated in FIG. 2D, the substrate 601 is attached on a back side of the substrate 301. The substrate 601 is attached on the back side of the substrate 301 so that a side on which the signal antenna 605 and the like are provided corresponds to the substrate 301 side. At the time of the attachment, the substrate 301 and the substrate 601 are provided so that the signal antenna 305 and the signal antenna 605 overlap with each other when viewed from above. In addition, the substrate 301 and the substrate 601 are provided so that the power antenna 306 and the power antenna 606 overlap with each other when viewed from above. In this manner, the signal antenna 305 and the signal antenna 605 overlap with each other with the substrate 301 provided therebetween to be fixed to each other. Further, the power antenna 306 and the power antenna 606 overlap with each other with the substrate 301 provided therebetween to be fixed to each other. Further, as illustrated in FIG. 2E, the substrate 301 may be attached on a back side of the substrate 601.

When the receiver antennas (the signal antenna 305 and the power antenna 306) and the transmitter antennas (the signal antenna 605 and the power antenna 606) overlap with each other with the substrate 301 or the substrate 601 provided therebetween to be fixed to each other in this manner, signals and power can be received highly efficiently. When reception efficiency is made high, a phenomenon that communication failure occurs only in the case of certain field intensity, i.e., a dropout phenomenon can be prevented.

Although not illustrated in FIGS. 2C to 2E, over the substrate 601, an insulating film can be provided over the signal antenna 605 and the power antenna 606. Similarly, over the substrate 301, an insulating film can be provided over the signal antenna 305 and the power antenna 306. These insulating films can function as protective films. Further, these insulating films can have a function of flattening surfaces of the substrates. In the case where the insulating film is provided over the power antenna 606, the insulating film can be used as a bond surface.

The substrate 301 and the substrate 601 can be attached to each other with an adhesive or the like. A material which firmly attaches a bond surface of the substrate 301 and a bond surface of the substrate 601 to each other can be used as the material of the adhesive. In addition, a material which can make the thickness of a layer of the adhesive (referred to as an adhesion layer) small can be used. When the adhesion layer is thin, the thickness of the adhesion layer can be made uniform in a plane.

In addition, a material into which an insulating filler is mixed may be used as the adhesive. When a material into which an insulating filler is mixed is used as the adhesive, the thickness of the adhesion layer can be further made uniform.

A region where the substrate 301 and the substrate 601 are attached to each other can be a region including a region where the antennas are provided over the substrate 301 and the substrate 601. For example, in the case of the substrate 301, a diagonally shaded region 341 shown in FIG. 2A can be used as an attachment region. In the case of the substrate 601, a diagonally shaded region 641 shown in FIG. 2B can be used as an attachment region. In this manner, the area of the region where the substrate 301 and the substrate 601 are attached to each other can be the same as or larger than the area of the antennas. The antennas have a certain size. Thus, the attachment portion has a certain size. Accordingly, the bond strength of the attachment portion can be made high.

The thickness of the substrate 301 can be in the range of from 0.1 to 3.0 mm. Thus, signals and power can be received highly efficiently. Further, a phenomenon that communication failure occurs only when the transmitter antenna and the receiver antenna are placed in a certain distance, i.e., a dropout phenomenon can be prevented. This is because the distance between the signal antenna 305 and the signal antenna 605 provided on the surface side and back side of the substrate 301 and the distance between the power antenna 306 and the power antenna 606 provided on the surface side and back side of the substrate 301 are determined mainly by the thickness of the substrate 301. In the case where the thickness of the substrate 301 exceeds the above range, the dropout phenomenon might occur. However, the thickness of the substrate 301 is not necessarily limited to the above range. The substrate 301 can have thickness which is beyond the above range as long as signals and power can be transmitted and received and the dropout phenomenon does not occur.

Note that although the signal antenna 305 and the signal processing portion 307 are separately illustrated in FIG. 1 and FIG. 2A, the signal antenna 305 may be included in the signal processing portion 307. In addition, although the power antenna 306 and the power source portion 308 are separately illustrated in FIG. 1 and FIG. 2A, the power antenna 306 may be included in the power source portion 308. Further, the shape of the antenna is not limited to a spiral shape. A rod shape, a loop shape, or the like can be used.

In this embodiment, a set of the signal antenna 305 (the receiver antenna) and the signal antenna 605 (the transmitter antenna) is provided; however, this embodiment is not limited to this. Plural sets of the signal antenna 305 and the signal antenna 605 can be provided. In that case, the plurality of signal antennas 305 (receiver antennas) can be provided in empty spaces of the substrate 301. In addition, some or all of the plurality of signal antennas 605 (transmitter antennas) can be provided over the substrate 601 which is provided with the power antenna 606. In the case where some of the plurality of signal antennas 605 (transmitter antennas) are provided over the substrate 601 which is provided with the power antenna 606, the other signal antennas 605 (the transmitter antennas) can be provided over a different substrate.

When plural sets of signal antennas 305 (receiver antennas) and signal antennas 605 (transmitter antennas) are provided in this manner, the transmitting and receiving speed of signals can be improved. According to this embodiment, the problem of bad connection in a portion connected to the outside is less likely to be caused as compared to the case where an FPC or the like is used. Accordingly, a structure where the number of signal input/output portions (i.e., the signal antenna 305 (the receiver antenna) and the signal antenna 605 (the transmitter antenna)) is increased can be easily employed.

In this embodiment, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between the antennas can be kept constant, so that signals and power can be received highly efficiently.

The semiconductor device described in this embodiment can be used as a display in a variety of devices such as a liquid crystal television, a personal computer, a cellular phone, an e-book reader, a digital camera, a personal digital assistant, and portable audio equipment.

The semiconductor device described in this embodiment is resistant to vibration or the change in temperature; thus, the semiconductor device can be used as a versatile display. For example, the semiconductor device can be used as a display provided in a vehicle such as a railroad train, an electric train, a car, a ship, or an airplane. In addition, the semiconductor device can be used as a display provided on a wall or a column of a construction such as a station or a building. Further, the semiconductor device can be used as a display provided in a portable device such as a cellular phone, an e-book reader, or a personal digital assistant. Furthermore, the semiconductor device can be used as a device having a waterproof function.

Moreover, the semiconductor device described in this embodiment can be used not only as a display but also an electronic component or an electronic device.

Further, the number of power lines is small. For example, the number of power lines per substrate can be two. Since the number of power lines is small in this manner, in the power source portion, a wiring provided over the substrate 301 can be directly connected to a wiring provided over the substrate 601. In that case, the power lines can be connected to an external terminal with the use of an FPC or the like. Accordingly, in the semiconductor device, it is possible not to provide the power antenna 306 and the power antenna 606. Also in that case, the number of signal lines is large; thus, the problem of contact failure generated in the FPC terminal portion can be solved when signals are supplied wirelessly. In addition, even in the case where signals are supplied wirelessly, the signals can be received highly efficiently. Further, even in the case where vibration is caused or the temperature is changed, the distance between the antennas can be kept constant, so that signals can be received highly efficiently.

This embodiment can be combined with any of the other embodiments and examples as appropriate.

Embodiment 2

An example of a semiconductor device which is one embodiment of the disclosed invention is described with reference to FIGS. 3A and 3B. In this embodiment, an example in which a substrate is a flexible substrate is described. Further, in this embodiment, an example in which a semiconductor device is a display is described.

Figure 3A:
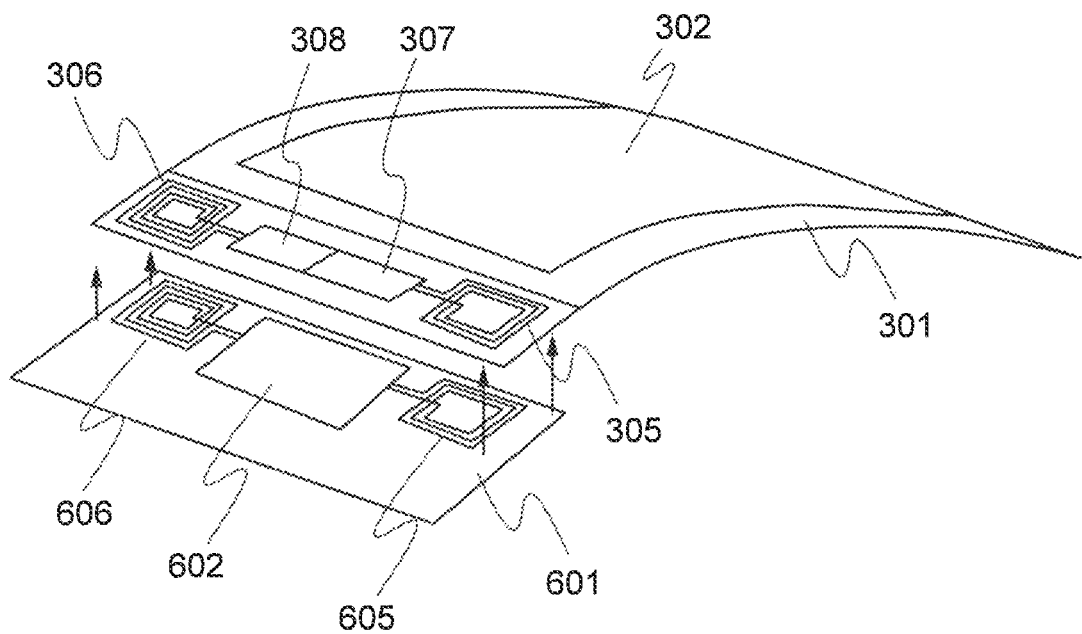
FIG. 3A is an example of a perspective view of the semiconductor device.
Figure 3B:
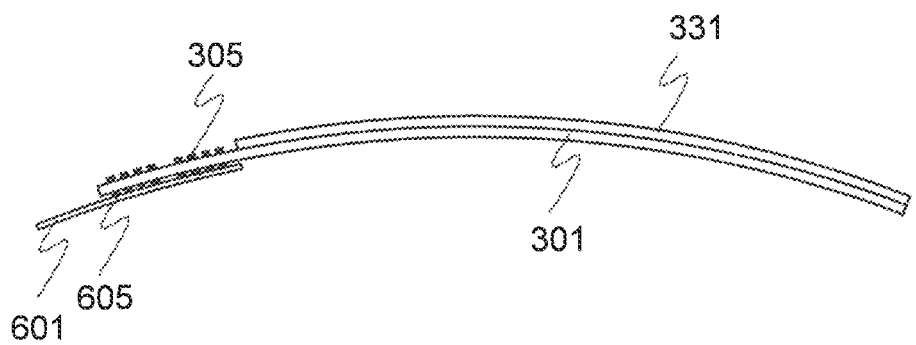
FIG. 3B is an example of a cross-sectional view of the semiconductor device.

FIGS. 3A and 3B are examples of the perspective view and the cross-sectional view of the substrate 301 and the substrate 601 which are included in the semiconductor device described in this embodiment.

FIG. 3A is an example of the perspective view of the substrate 301 and the substrate 601. The structure in FIG. 3A is substantially the same as the structure in FIG. 1, the structure in FIG. 2A, and the structure in FIG. 2B. That is, the substrate 301 illustrated in FIG. 3A is provided with the signal antenna 305 and the power antenna 306. The signal antenna 305 and the power antenna 306 are used as receiver antennas. In addition, the signal processing portion 307 and the power source portion 308 are provided so as to be electrically connected to the antennas. Further, the substrate 301 is provided with the pixel portion 302. Although FIG. 3A does not illustrate a scan line driver circuit and a signal line driver circuit, the semiconductor device illustrated in FIG. 3A can include a scan line driver circuit and a signal line driver circuit as in FIG. 1.

The substrate 601 illustrated in FIG. 3A is provided with the signal antenna 605 and the power antenna 606. The signal antenna 605 and the power antenna 606 are used as transmitter antennas. In addition, the integrated circuit 602 is provided so as to be electrically connected to the antennas.

FIG. 3B is an example of the cross-sectional view of the substrate 301 and the substrate 601 after being attached to each other. As illustrated in FIG. 3B, the substrate 601 is attached on a back side of the substrate 301. The substrate 601 is attached on the back side of the substrate 301 so that a side on which the signal antenna 605 and the like are provided corresponds to the substrate 301 side. At the time of the attachment, the substrate 301 and the substrate 601 are provided so that the signal antenna 305 and the signal antenna 605 overlap with each other when viewed from above. In addition, the substrate 301 and the substrate 601 are provided so that the power antenna 306 and the power antenna 606 overlap with each other when viewed from above. In this manner, the receiver antennas (the signal antenna 305 and the power antenna 306) and the transmitter antennas (the signal antenna 605 and the power antenna 606) overlap with each other with the substrate 301 provided therebetween to be fixed to each other.

In this embodiment, flexible substrates are used as the substrate 301 and the substrate 601. A flexible substrate is a substrate that can be bent (is flexible), for example, a plastic substrate including polycarbonate, polyarylate, or polyether sulfone, or the like. Alternatively, a film (a film including polypropylene, polyester, vinyl, polyvinyl fluoride, vinyl chloride, or the like), an inorganic vapor deposition film, or the like can be used.

The flexible substrate is bent in some cases. Thus, for example, in the case where the receiver antenna is provided over the flexible substrate and the transmitter antenna is provided over a different substrate, the distance between the receiver antenna and the transmitter antenna cannot be kept constant in some cases. However, in this embodiment, the receiver antennas (the signal antenna 305 and the power antenna 306) and the transmitter antennas (the signal antenna 605 and the power antenna 606) are fixed to the substrate 301. Thus, even in the case where the substrate 301 is bent as illustrated in FIG. 3B, the distance between the receiver antenna and the transmitter antenna can be kept constant. Accordingly, even in the case where the substrate 301 is bent, signals and power can be received highly efficiently.

In this manner, in the semiconductor device of this embodiment, the substrate 301 can be bent. The semiconductor device can have various structures when the substrate 301 is bent. Any substrate can be used as the substrate 301 as long as it has a certain thickness and includes a material which transmits an electromagnetic wave with frequency used for transmission and reception of signals and power. An insulating material can be used as a material which transmits an electromagnetic wave with frequency used for transmission and reception of signals and power. In addition, a flexible substrate can be used as the substrate 601 attached to the substrate 301. When a flexible substrate is used as the substrate 601, in the case where the substrate 301 is bent, the substrate 601 is bent similarly. Therefore, even in the case where the substrate is bent, the distance between the antennas can be kept constant.

In this embodiment, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between the antennas can be kept constant, so that signals and power can be received highly efficiently.

Furthermore, even in the case where a flexible substrate is used as the substrate, the distance between the antennas can be kept constant, so that signals and power can be received highly efficiently. Therefore, the semiconductor device can have various structures when the substrate is bent.

This embodiment can be combined with any of the other embodiments and the examples as appropriate.

Embodiment 3

In this embodiment, examples of the structure and operation of a semiconductor device which is one embodiment of the disclosed invention are described with reference to FIG. 4 and FIG. 5. In this embodiment, an example in which a semiconductor device is a display is described.

Figure 4:
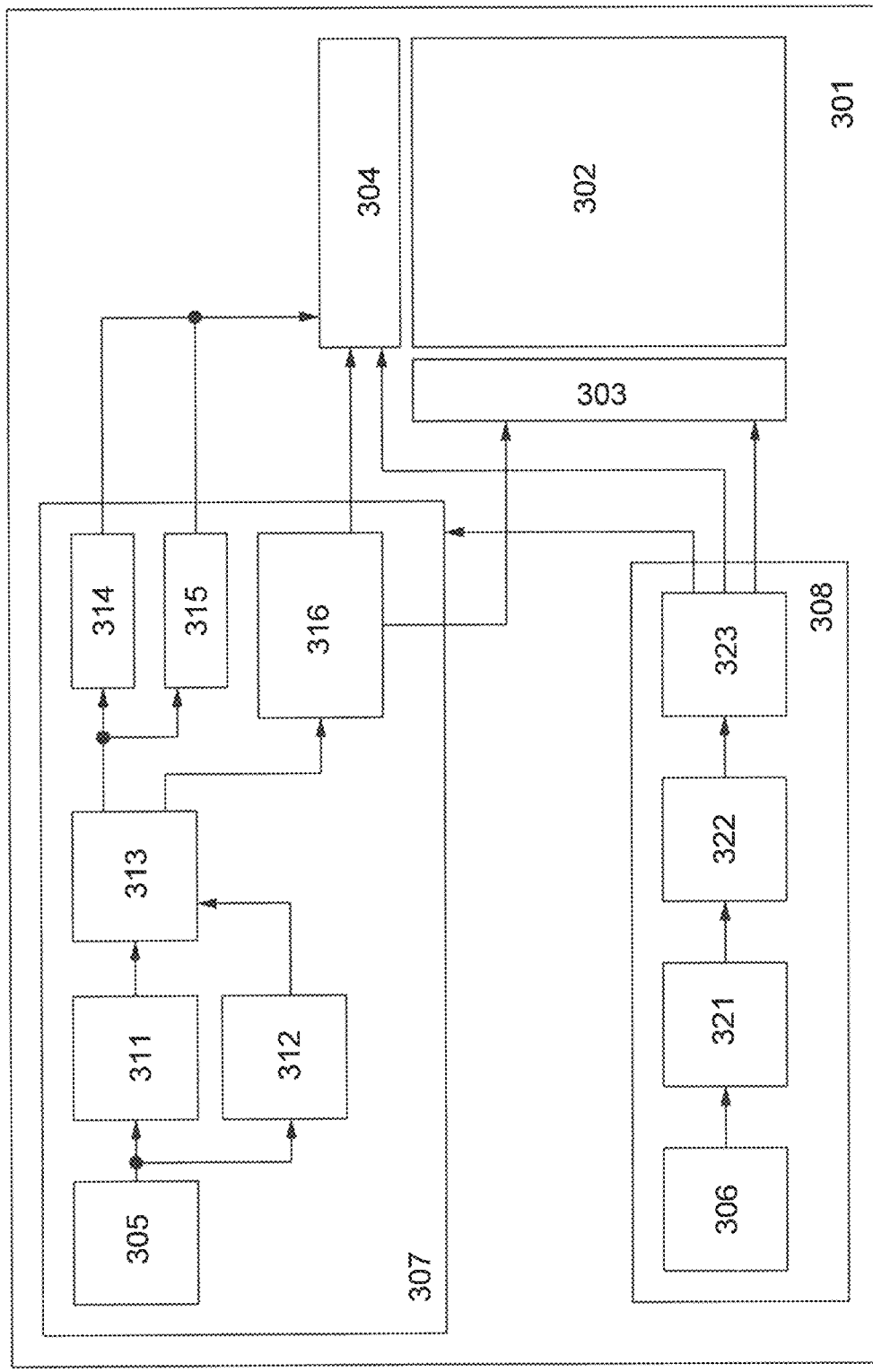
FIG. 4 is an example of a block diagram of the semiconductor device.

FIG. 4 is an example of the block diagram of the semiconductor device described in this embodiment. Here, the substrate 301 included in the semiconductor device is described.

As illustrated in FIG. 4, the substrate 301 includes the signal processing portion 307 having the signal antenna 305, the power source portion 308 having the power antenna 306, the pixel portion 302, and the scan line driver circuit 303 and the signal line driver circuit 304 for driving the pixel portion 302.

The signal processing portion 307 includes the signal antenna 305, a demodulation circuit 311, a clock generator 312, a signal processing circuit 313, a memory circuit 314, a memory circuit 315, a display controller 316, and the like. The power source portion 308 includes the power antenna 306, a rectifier circuit 321, a battery (or a capacitor) 322, a DC-DC converter 323, and the like. The signal antenna 305 and the power antenna 306 are used as receiver antennas.

Figure 5:
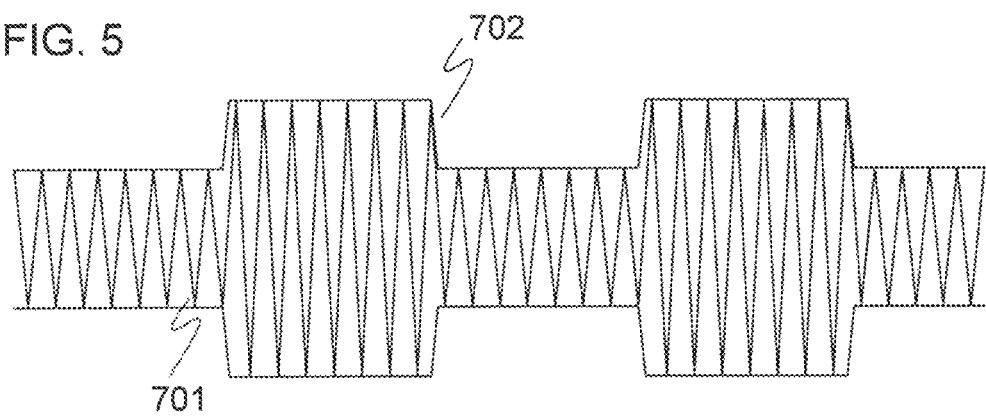
FIG. 5 is an example of a waveform of a signal input to the semiconductor device.

FIG. 5 shows the waveform of a signal input to the signal antenna 305 included in the semiconductor device described in this embodiment. The signal is modulated and includes a modulated wave 702 and a non-modulated wave 701. The reliability of the modulated wave can be improved when the modulated wave is encoded to be transmitted. Manchester encoding, deformable mirrors, NRZ, or the like can be used as the encoding method; however, this embodiment is not limited to this.

In addition, 13.56 MHz can be used as the frequency of the non-modulated wave 701; however, the frequency of the non-modulated wave 701 is not limited to this frequency. The amount of data can be increased when the frequency is made high.

Next, the operation of the semiconductor device in this embodiment is described. A signal input to the signal antenna 305 is input to the demodulation circuit 311 and the clock generator 312. A modulated wave (the modulated wave 702 shown in FIG. 5) is demodulated in the demodulation circuit 311. The demodulation circuit 311 includes a rectifier circuit having a diode, for example; however, this embodiment is not limited to this. Further, the clock generator 312 generates a clock signal with the use of a non-modulated wave (the non-modulated wave 701 shown in FIG. 5). The clock signal may have the frequency of the non-modulated wave (the non-modulated wave 701 shown in FIG. 5) or frequency which is lowered using a frequency divider.

The demodulated signal and the clock signal are input to the signal processing circuit 313 and decoded to be original image signals. The image signals are input to the memory circuit 314, the memory circuit 315, and the display controller 316. From the image signals, the display controller 316 outputs clock signals, start pulses, latch pulses, and the like for the scan line driver circuit 303 and the signal line driver circuit 304 which drive the pixel portion 302. Further, the signal processing circuit 313 extracts data to be input to the pixel portion 302 from the image signals and inputs the data to the memory circuit 314 and the memory circuit 315. Two memory circuits are provided in order that while the transmitted data is stored in one memory, data be read from the other memory to be displayed. When subsequent data is stored, the memory for storing the data and the memory for reading the data may be interchanged with each other.

Then, the power source portion 308 is described. The power source portion 308 includes the power antenna 306, the rectifier circuit 321, the battery (or the capacitor) 322, the DC-DC converter 323, and the like. A demodulation circuit having a diode is generally used for the rectifier circuit 321; however, this embodiment is not limited to this. Rectified voltage is stored in the battery (or the capacitor) 322. Then, power (also referred to as power supply voltage) is supplied to the signal processing portion 307, the scan line driver circuit 303, and the signal line driver circuit 304 through the DC-DC converter 323. Frequency for power supply does not necessarily correspond to frequency for signal supply. The frequencies may be different from each other.

Circuits such as the demodulation circuit 311, the clock generator 312, the signal processing circuit 313, the memory circuit 314, the memory circuit 315, the display controller 316, the rectifier circuit 321, and the DC-DC converter 323 may each include a transistor with the same structure as the transistor included in each of the plurality of pixels in the pixel portion 302, may include a transistor with a structure which is different from the structure of the transistor included in the pixel, or may be provided with an IC chip.

The substrate 601 illustrated in FIGS. 2A to 2E and FIGS. 3A and 3B can be attached to the substrate 301 included in the semiconductor device described in this embodiment.

In this embodiment, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between the antennas can be kept constant, so that signals and power can be received highly efficiently.

This embodiment can be combined with any of the other embodiments and the examples as appropriate.

Embodiment 4

In this embodiment, an example of a semiconductor device which is one embodiment of the disclosed invention is described with reference to FIG. 6. In this embodiment, an example in which one antenna is used as a signal antenna and a power antenna is described. Further, in this embodiment, an example in which a semiconductor device is a display is described.

Figure 6:
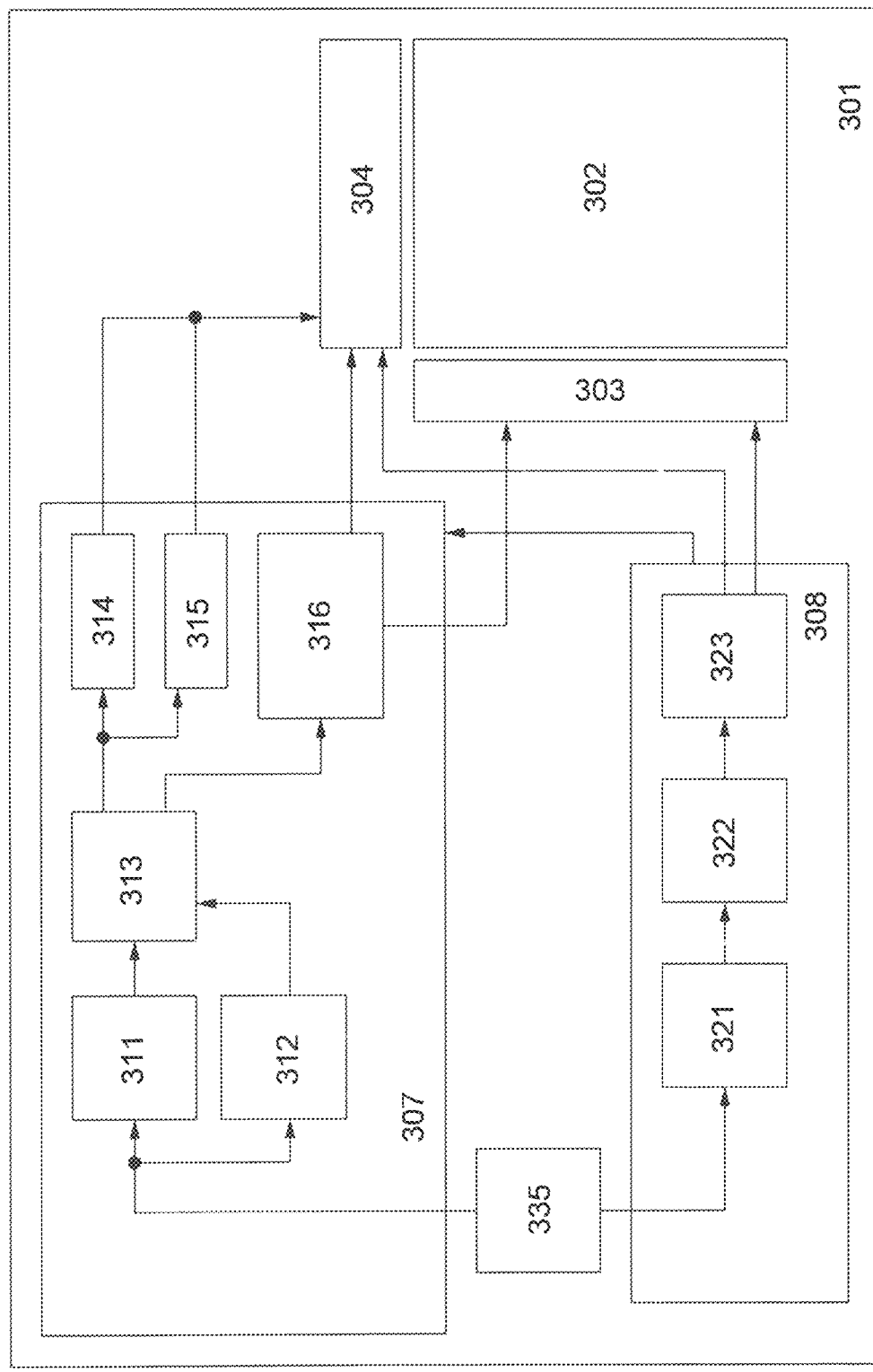
FIG. 6 is an example of a block diagram of the semiconductor device.

FIG. 6 is an example of the block diagram of the semiconductor device described in this embodiment. Here, the substrate 301 included in the semiconductor device is described.

As illustrated in FIG. 6, the substrate 301 includes an antenna 335, the signal processing portion 307, the power source portion 308, the pixel portion 302, and the scan line driver circuit 303 and the signal line driver circuit 304 for driving the pixel portion 302.

The antenna 335 serves as both a signal antenna and a power antenna. The antenna 335 is used as a receiver antenna. When one antenna is used as a signal antenna and a power antenna in this manner, a space in which an antenna is provided can be saved. In that case, frequency for power supply and frequency for signal supply are the same.

The structures and operations (except the structure and operation of the antenna 335) are similar to those in FIG. 4.

The substrate 601 illustrated in FIGS. 2A to 2E and FIGS. 3A and 3B can be attached to the substrate 301 included in the semiconductor device described in this embodiment.

In this embodiment, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between the antennas can be kept constant, so that signals and power can be received highly efficiently. Furthermore, a space in which an antenna is provided can be saved.

This embodiment can be combined with any of the other embodiments and the examples as appropriate.

Embodiment 5

In this embodiment, examples of a semiconductor device which is one embodiment of the disclosed invention are described with reference to FIGS. 7A and 7B and FIGS. 8A to 8C. In this embodiment, examples of a pixel portion included in the semiconductor device and a driver circuit which drives the pixel portion when the semiconductor device is a display are described. Specifically, in this embodiment, examples of the pixel portion and the driver circuit which drives the pixel portion when the semiconductor device is an active-matrix liquid crystal display where transistors are arranged in matrix in the pixel portion are described with reference to FIGS. 7A and 7B and FIGS. 8A to 8C. In this embodiment, a liquid crystal element is used as a display element.

Figure 7A:
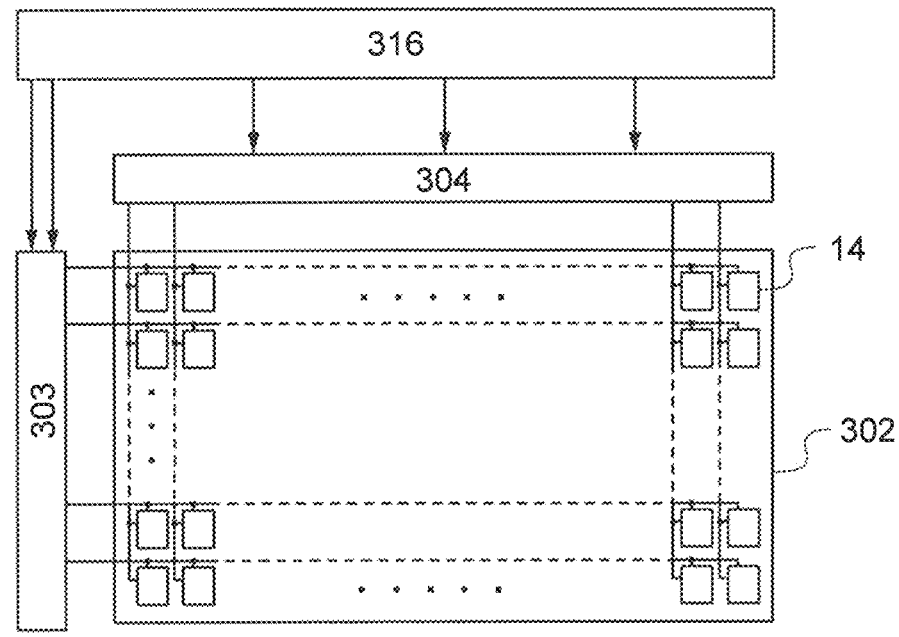
FIGS. 7A and 7B are examples of a structure of a pixel portion included in the semiconductor device.
Figure 7B:
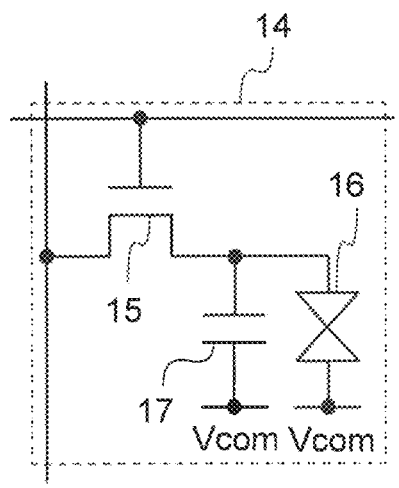

FIG. 7A illustrates a structure example of the liquid crystal display. As illustrated in FIG. 7A, the liquid crystal display includes the scan line driver circuit 303, the signal line driver circuit 304, and the pixel portion 302. The pixel portion 302 includes a plurality of pixels 14 arranged in matrix. FIG. 7B illustrates a structure example of the pixel. The pixel 14 illustrated in FIG. 7B includes a transistor 15, a liquid crystal element 16, and a capacitor 17. A gate terminal of the transistor 15 is electrically connected to the scan line driver circuit 303. A first terminal of the transistor 15 is electrically connected to the signal line driver circuit 304. One terminal of the liquid crystal element 16 is electrically connected to a second terminal of the transistor 15. The other terminal of the liquid crystal element 16 is electrically connected to a wiring for supplying a common potential ($V_{com}$). One terminal of the capacitor 17 is electrically connected to the second terminal of the transistor 15 and the one terminal of the liquid crystal element 16. The other terminal of the capacitor 17 is electrically connected to a wiring for supplying the common potential ($V_{com}$). For the scan line driver circuit 303 and the signal line driver circuit 304, transistors provided over the substrate included in the semiconductor device that are similar to the transistors 15 in the pixel portion may be used, or an IC chip may be attached onto the substrate included in the semiconductor device by chip on glass (COG).

In the liquid crystal display of this embodiment, on/off of the transistor 15 is controlled by the scan line driver circuit 303, and an image signal is input to the liquid crystal element 16 from the signal line driver circuit 304 through the transistor 15. Note that the liquid crystal element 16 includes a liquid crystal layer held between the one terminal and the other terminal. Voltage which corresponds to a difference between the potential of the image signal and the common potential ($V_{com}$) is applied to the liquid crystal layer and is used for control of the alignment of the liquid crystal layer. In the liquid crystal display of this embodiment, display of the pixel 14 is controlled utilizing the alignment. Note that the capacitor 17 is provided in order to hold voltage applied to the liquid crystal element 16.

Further, in the liquid crystal display described in this embodiment, when the operation of the scan line driver circuit 303 and the signal line driver circuit 304 is controlled by the display controller 316, input of an image signal to the pixel portion 302 can be selected.

<Transistor>

The transistor 15 is a transistor whose channel formation region includes an oxide semiconductor layer. The oxide semiconductor layer is an oxide semiconductor layer which is high-purity and is made to be electrically i-type (intrinsic) or substantially i-type (intrinsic) by drastic removal of an impurity that causes variation in electrical characteristics of the transistor, such as hydrogen, moisture, a hydroxyl group, or hydride and by supply of oxygen which is a main component of the oxide semiconductor that is simultaneously reduced in a step of removing the impurity. Note that the oxide semiconductor included in the oxide semiconductor layer has a band gap of 3.0 eV or more.

Further, the number of carriers in the high-purity oxide semiconductor is significantly small (close to zero), and the carrier density of the oxide semiconductor is significantly low (e.g., lower than $1\times10^{12}/cm^3$, preferably lower than $1\times10^{11}/cm^3$). Thus, the off-state current of the transistor is significantly low. Therefore, in the transistor, off-state current per micrometer of the channel width (W) at room temperature can be 1 aA/μm ($1\times10^{-18}$ A/μm) or less, or less than 100 zA/μm ($1\times10^{-19}$ A/μm). Note that in general, in the case of a transistor including amorphous silicon, off-state current at room temperature is $1\times10^{-13}$ A/μm or more. Further, hot carrier degradation does not occur in the transistor. Accordingly, the electrical characteristics of the transistor are not adversely affected by hot carrier degradation.

Thus, an image signal can be held in each of the pixels 14 for a longer period. That is, an interval between rewrites of image signals when still images are displayed can be extended. For example, an interval between writes of image signals can be 10 seconds or longer, preferably 30 seconds or longer, more preferably 1 minute or longer and shorter than 10 minutes. When the interval between writes of image signals is extended, power consumption can be reduced by the extended interval.

Note that the resistance to flow of the off-state current of a transistor can be referred to as off-state resistivity. The off-state resistivity is resistivity of a channel formation region when the transistor is off, and the off-state resistivity can be calculated from the off-state current.

Specifically, if the amount of off-state current and the level of drain voltage are known, resistance when the transistor is off (off resistance R) can be calculated using Ohm's law. In addition, if a cross section A of the channel formation region and the length L of the channel formation region (the length corresponds to a distance between a source electrode and a drain electrode) are known, off-state resistivity ρ can be calculated from the formula ρ=RA/L (R is off resistance).

Here, the cross section A can be calculated from the formula A=dW (d is the thickness of the channel formation region and W is the channel width). In addition, the length L of the channel formation region is channel length L. In this manner, the off-state resistivity can be calculated from the off-state current.

The off-state resistivity of the transistor including an oxide semiconductor layer in this embodiment is preferably $1\times10^{11}$ Ω·cm (100 GΩ·cm) or more, more preferably $1\times10^{12}$ Ω·cm (1 TΩ·cm) or more.

By drastically removing hydrogen contained in an oxide semiconductor layer as described above, in a transistor which includes a high-purity oxide semiconductor layer in a channel formation region, the amount of off-state current can be significantly reduced. In other words, in circuit design, the oxide semiconductor layer can be regarded as an insulator when the transistor is off (non-conducting). In contrast, the current supply capability of a transistor which includes an oxide semiconductor in a channel formation region is expected to be higher than that of a transistor including amorphous silicon when the transistor is on (conducting).

A transistor including low-temperature polysilicon is designed on the assumption that off-state current at room temperature is about 10000 times that of a transistor including an oxide semiconductor. Therefore, in the case where the transistor including an oxide semiconductor is compared with the transistor including low-temperature polysilicon, the voltage hold time of the transistor including an oxide semiconductor can be extended about 10000 times when storage capacitances are equal or substantially equal to each other (about 0.1 pF). Accordingly, still images can be displayed even by less frequent writing of image signals.

When the image signal hold time of the pixels 14 is extended as described above, the frequency of supply of image signals to the pixels can be reduced. In one embodiment of the present invention, signals are transmitted and received wirelessly (without contact). Therefore, a technique by which a transistor including an oxide semiconductor is used as a transistor in a pixel and write frequency and transmitting and receiving speed of signals can be lowered as described above is very useful in one embodiment of the present invention. Display degradation (change) in the pixel can be suppressed when the transistor is used as a transistor for controlling input of an image signal to the pixel.

Further, when the transistor is used as a switch for controlling input of an image signal to a pixel, the size of a capacitor provided in the pixel can be made small. Thus, the aperture ratio of the pixel can be improved and an image signal can be input to the pixel at high speed, for example.

Note that in this specification, a semiconductor with a carrier concentration lower than $1\times10^{11}/cm^3$ is called an intrinsic (i-type) semiconductor, and a semiconductor with a carrier concentration higher than or equal to $1\times10^{11}/cm^3$ and lower than $1\times10^{12}/cm^3$ is called a substantially intrinsic (substantially i-type) semiconductor.

<Liquid Crystal Element and Capacitor>

Figure 8A:
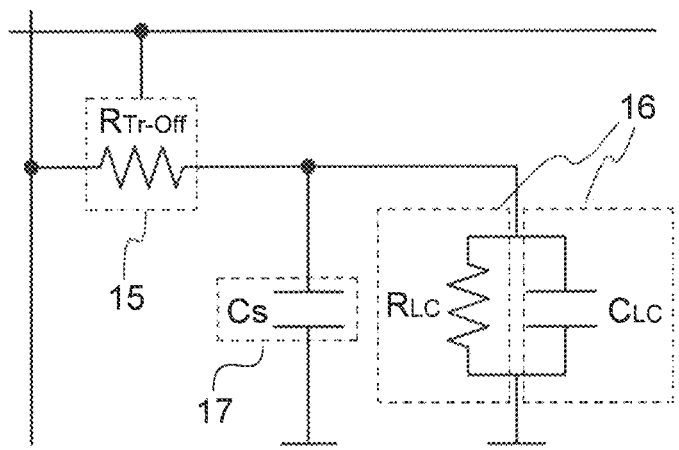
FIGS. 8A to 8C are schematic views illustrating leak paths of image signals in the pixel portion included in the semiconductor device.
Figure 8B:
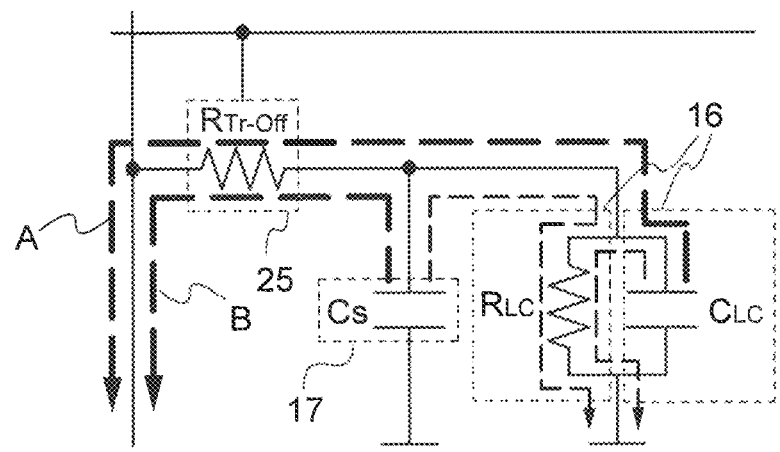

In the case where the transistor is used as the transistor 15 for controlling input of an image signal, it is preferable that a substance with high specific resistivity be used as the liquid crystal material of the liquid crystal element 16. Here, the reason for using a substance with high specific resistivity is described with reference to FIGS. 8A to 8C. Note that FIG. 8B is a schematic view for illustrating the leak path of an image signal in a pixel which includes a transistor including amorphous silicon and the leak path of an image signal in a pixel which includes the transistor including an oxide semiconductor.

Figure 8C:
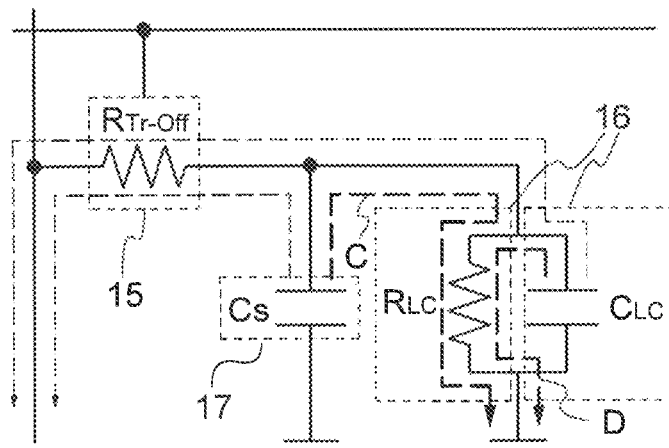

As illustrated in FIG. 7B, the pixel includes the transistor 15, the liquid crystal element 16, and the capacitor 17. The circuit illustrated in FIG. 7B is equivalent to a circuit illustrated in FIG. 8A when the transistor 15 is off. That is, the circuit illustrated in FIG. 7B is equivalent to a circuit in which the transistor 15 is assumed to be a resistor ($R_{Tr-Off}$), and the liquid crystal element 16 is assumed to include a resistor ($R_{LC}$) and a capacitor ($C_{LC}$). When an image signal is input to the pixel, the image signal is stored in the capacitor 17 ($C_S$) and the capacitor of the liquid crystal element 16 ($C_{LC}$) (see FIG. 7B and FIG. 8A). Then, when the transistor 15 is turned off, the image signal leaks through the transistor 15 and the liquid crystal element 16, as illustrated in FIGS. 8B and 8C. Note that FIG. 8B is a schematic view illustrating leak of an image signal when the transistor is a transistor 25 including amorphous silicon, and FIG. 8C is a schematic view illustrating leak of an image signal when the transistor is the transistor 15 including an oxide semiconductor. The off-state resistance of the transistor 25 including amorphous silicon is lower than the resistance of the liquid crystal element. Therefore, the image signal leaks mainly through the transistor 25 including amorphous silicon, as illustrated in FIG. 8B (i.e., the image signal leaks mainly through a path A and a path B in FIG. 8B). In contrast, the off-state resistance of the transistor 15 including a high-purity oxide semiconductor is higher than the resistance of the liquid crystal element. Therefore, the image signal leaks mainly through the liquid crystal element, as illustrated in FIG. 8C (i.e., the image signal leaks mainly through a path C and a path D in FIG. 8C).

In other words, although characteristics of a transistor provided in each pixel of a liquid crystal display have been conventionally a rate-controlling point in image signal holding characteristics in each pixel, when the transistor 15 including a high-purity oxide semiconductor is used as a transistor provided in each pixel, a rate-controlling point therein is shifted to the resistance of a liquid crystal element. Therefore, it is preferable that a substance with high specific resistivity be used as the liquid crystal material of the liquid crystal element 16.

Specifically, in a liquid crystal display device whose pixel is provided with the transistor 15 including a high-purity oxide semiconductor, the specific resistivity of a liquid crystal material is preferably $1\times10^{12}$ Ω·cm (1 T Ω·cm) or higher, more preferably higher than $1\times10^{13}$ Ω·cm (10 T Ω·cm), still preferably higher than $1\times10^{14}$ Ω·cm (100 T Ω·cm). The specific resistance in this specification is measured at 20° C.

In the still image hold period, the other terminal of the liquid crystal element 16 can be made to be in a floating state without being supplied with the common potential ($V_{com}$). Specifically, a switch may be provided between the terminal and a power source for supplying the common potential ($V_{com}$). The switch may be turned on in a writing period so that the common potential ($V_{com}$) may be supplied from the power source. Then, the switch may be turned off in the remaining hold period and the terminal may be made to be in a floating state. It is preferable that the transistor including a high-purity oxide semiconductor be used for the switch. When the other terminal of the liquid crystal element 16 is made to be in a floating state, display degradation (change) in the pixel 14 due to an irregular pulse or the like can be suppressed. The reason is described as follows. When the potential of the first terminal of the transistor 15 which is off fluctuates by an irregular pulse, the potential of the one terminal of the liquid crystal element 16 also fluctuates by capacitive coupling. At this time, if the common potential ($V_{com}$) is supplied to the other terminal of the liquid crystal element 16, the fluctuation in potential is directly linked to the change in voltage applied to the liquid crystal element 16. When the other terminal of the liquid crystal element 16 is in a floating state, the potential of the other terminal fluctuates by capacitive coupling. Accordingly, even when the potential of the first terminal of the transistor 15 fluctuates by an irregular pulse, the change in voltage applied to the liquid crystal element 16 can be reduced. Therefore, display degradation (change) in the pixel 14 can be suppressed.

The capacitance of the capacitor 17 ($C_S$) is set in consideration of the off-state current of a transistor in each pixel, or the like. Note that a variety of numeric values in the above description are estimates.

A reflective liquid crystal element is preferably used as a liquid crystal element used in this embodiment. A reflective liquid crystal element can be obtained by formation of a reflective electrode as a pixel electrode. Thus, power consumed by a backlight can be reduced, so that the power consumption of the semiconductor device can be reduced.

In addition, although an example in which a liquid crystal element is used as a display element is described in this embodiment, a light-emitting element or an electrophoretic element can be used instead of the liquid crystal element. When an electrophoretic element is used, power consumption can be reduced. Further, when an electrophoretic element or a light-emitting element is used, a substrate which can be bent can be employed easily.

The transistor including an oxide semiconductor in this embodiment has an electrical characteristic of much lower off-state current than a transistor including silicon or the like. Therefore, when the transistor including an oxide semiconductor in this embodiment is used as a transistor in a pixel portion, an image signal written to the display element can be held for a long period without a change in the circuit structure or the like of the pixel. Accordingly, in the case where still images or the like is displayed, write frequency can be lowered. Thus, power consumption can be reduced.

With the transistor, an image signal written to the display element can be held for a long period. Accordingly, even in the case where write frequency is low, degradation (change) in display of the pixel can be suppressed.

A substrate including the pixel portion and the like in this embodiment can be used as the substrate 301 illustrated in FIG. 1, FIGS. 2A to 2E, FIGS. 3A and 3B, FIG. 4, and FIG. 6. That is, the substrate 601 illustrated in FIGS. 2A to 2E and FIGS. 3A and 3B can be attached to the substrate including the pixel portion and the like in this embodiment.

This embodiment can be combined with any of the other embodiments and the examples as appropriate.

Embodiment 6

In this embodiment, an example of the operation of a semiconductor device which is one embodiment of the disclosed invention is described with reference to FIG. 4 and FIG. 5. In this embodiment, the relationship between the frequency of an image signal and image processing is described.

FIG. 5 shows the waveform of a signal input to the signal antenna 305 included in the semiconductor device described in this embodiment. The signal is modulated and includes the modulated wave 702 and the non-modulated wave 701.

13.56 MHz can be used as the frequency of the non-modulated wave 701. In that case, it is preferable that the modulated wave have a frequency less than or equal to ⅛ the frequency of the non-modulated wave. When the frequency of the modulated wave is ⅛ the frequency of the non-modulated wave, the frequency of the modulated wave is 1.695 MHz. When the number of pixels in the pixel portion 302 included in the semiconductor device is VGA (640×480 dots), images cannot be displayed without any operation because the dot clock of VGA is originally 25 MHz.

In addition, when the number of colors in the display is 65500, 16 bits are needed in each pixel. The frequency is obtained in the case of a monochrome 1 bit. Thus, the frequency is 1/16 in the case of 16 bits, so that the frequency is 106 kHz. The frequency is 1/236 the dot clock of VGA (25 MHz).

In general, image signals are written 60 times per second (at 60 fps). However, in the semiconductor device described in this embodiment, write frequency is decreased to 1/236. Accordingly, an image signal is written once about every four seconds (at about 0.25 fps).

Therefore, in the case where a transistor including amorphous silicon or a transistor including polysilicon is used in the pixel, image signals cannot be held for four seconds. Thus, it is necessary to reduce the number of image signals by the decrease in the number of pixels or the decrease in the number of colors as compared to VGA.

In contrast, in the semiconductor device described in this embodiment, as illustrated in FIGS. 7A and 7B and FIGS. 8A to 8C, a transistor including a high-purity oxide semiconductor layer is used as the transistor included in the pixel. Thus, image signals can be held for a long period because the off-state current of the transistor included in the pixel at room temperature can be 1 aA/μm or lower, or lower than 100 zA/μm when the high-purity oxide semiconductor layer is used as described above. For example, in the case where an image with the resolution of VGA or the like is displayed, the image signal can be held for 2000 seconds (i.e., 30 minutes or longer) when a transistor whose off-state current is 1 aA/μm or lower is used as the transistor in the pixel. Further, an image signal can be held for 20000 seconds (i.e., 330 minutes or longer) when a transistor whose off-state current is lower than 100 zA/μm is used. Accordingly, in the semiconductor device described in this embodiment, an image with the resolution of VGA or higher can be displayed.

According to this embodiment, the problem of contact failure generated in an FPC terminal portion can be solved when signals and power are supplied wirelessly without the use of an FPC. In addition, even in the case where signals and power are supplied wirelessly, the signals and power can be received highly efficiently. Further, even in the case where vibration is caused or the temperature is changed, the distance between antennas can be kept constant, so that signals and power can be received highly efficiently. Furthermore, an image with the resolution of VGA or the like can be displayed.

This embodiment can be combined with any of the other embodiments and the examples as appropriate.

Embodiment 7

In this embodiment, an example of a transistor in a pixel portion included in a semiconductor device which is one embodiment of the disclosed invention is described with reference to FIGS. 9A to 9D.

FIGS. 9A to 9D are cross-sectional views illustrating examples of the structure of the transistor illustrated in FIGS. 7A and 7B and a method for manufacturing the transistor. A transistor 410 illustrated in FIG. 9D has a kind of bottom-gate structure called an inverted-staggered structure. Further, the transistor 410 has a channel-etched structure. Furthermore, the transistor 410 has a single-gate structure.

However, the structure of the transistor is not limited to the above. The transistor may have a top-gate structure. Further, the transistor may have a channel-stop structure. Furthermore, the transistor may have a multi-gate structure.

Steps of manufacturing the transistor 410 over a substrate 400 are described below with reference to FIGS. 9A to 9D.

Figure 9A:
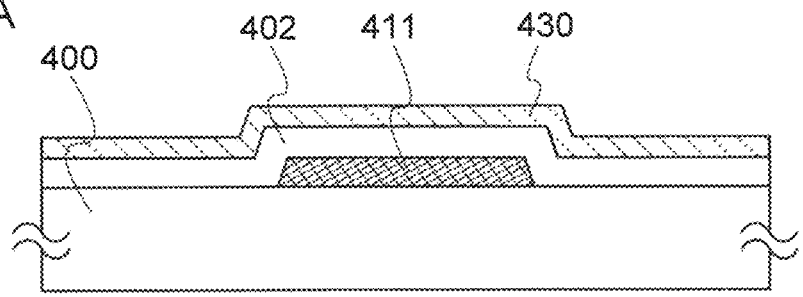
FIGS. 9A to 9D are examples of a structure of a transistor included in the semiconductor device and a manufacturing method thereof.

First, a gate electrode layer 411 is formed over the substrate 400 having an insulating surface (see FIG. 9A).

Although there is no particular limitation on a substrate which can be used as the substrate 400 having an insulating surface, it is necessary that the substrate have at least heat resistance high enough to withstand heat treatment to be performed later.

An insulating film serving as a base film may be provided between the substrate 400 and the gate electrode layer 411. The base film has a function of preventing diffusion of an impurity element from the substrate 400, and can be formed to have a single-layer structure or a layered structure including one or more films selected from a silicon nitride film, a silicon oxide film, a silicon nitride oxide film, or a silicon oxynitride film. Here, a 100-nm-thick silicon nitride film is formed by plasma-enhanced CVD, and a 150-nm-thick silicon oxynitride film (SiON film) is formed over the silicon nitride film by plasma-enhanced CVD.

Note that the base film is preferably formed so as to contain impurities such as hydrogen and water as little as possible.

A conductive layer is formed over the substrate 400 and is selectively etched through a first photolithography process, so that the gate electrode layer 411 can be formed.

The gate electrode layer 411 can be formed to have a single-layer structure or a layered structure including a metal material such as molybdenum, titanium, chromium, tantalum, tungsten, aluminum, copper, neodymium, or scandium, or an alloy material which includes any of these metal elements as a main component. Here, a 100-nm-thick tungsten film is formed by sputtering and is etched to be the gate electrode layer 411.

Then, a gate insulating layer 402 is formed over the gate electrode layer 411 (see FIG. 9A).

The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like. For example, a silicon oxynitride layer may be formed using silane ($SiH_4$), oxygen, and nitrogen as a deposition gas by plasma-enhanced CVD. Alternatively, a high-k material such as hafnium oxide ($HfO_x$) or tantalum oxide ($TaO_x$) can be used for the gate insulating layer. The thickness of the gate insulating layer 402 can be, for example, 10 to 500 nm.

Here, a 30-nm-thick silicon oxynitride film which serves as a gate insulating layer is formed over the gate electrode layer 411 by high-density plasma-enhanced CVD using microwaves (e.g., a frequency of 2.45 GHz). The high-density plasma-enhanced CVD using microwaves is preferable because the dense high-quality insulating layer 402 having high withstand voltage can be formed. When an oxide semiconductor layer and the high-quality gate insulating layer 402 are in close contact with each other, interface state density can be reduced and interface properties can be favorable.

Note that the gate insulating layer 402 is preferably formed so as to contain impurities such as hydrogen and water as little as possible.

Then, an oxide semiconductor film 430 is formed over the gate insulating layer 402 (see FIG. 9A). The oxide semiconductor film 430 can be formed by sputtering. The thickness of the oxide semiconductor film 430 can be 2 to 200 nm.

Note that before the oxide semiconductor film 430 is formed by sputtering, it is preferable to perform reverse sputtering in which an argon gas is introduced and plasma is generated. Powdery substances (also referred to as particles or dust) on a surface of the gate insulating layer 402 can be removed by the reverse sputtering. The reverse sputtering is a method in which, without application of voltage to a target side, an RF power source is used for application of voltage to a substrate side and plasma is generated so that a substrate surface is modified. Note that nitrogen, helium, oxygen, or the like may be used instead of the argon atmosphere.

As the oxide semiconductor film 430, an In—Ga—Zn—O-based material, an In—Sn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, an In—O-based material, a Sn—O-based material, or a Zn—O-based material can be used. In addition, the material may contain $SiO_2$.

The oxide semiconductor film 430 can be formed by sputtering in a rare gas (typically argon) atmosphere, an oxygen atmosphere, or an atmosphere including a rare gas (typically argon) and oxygen.

Here, a 30-nm-thick oxide semiconductor layer is formed by sputtering with the use of an In—Ga—Zn—O-based metal oxide target that contains In, Ga, and Zn ($In_2O_3$:$Ga_2O_3$:ZnO=1:1:2 in a molar ratio). Note that a sputtering gas has a flow rate of $Ar/O_2$=0/20 sccm (oxygen:100%); the temperature of the substrate is room temperature; deposition pressure is 0.6 Pa; and deposition power is 0.5 kW.

Note that the oxide semiconductor film 430 is preferably formed so as to contain impurities such as hydrogen and water as little as possible.

Figure 9B:
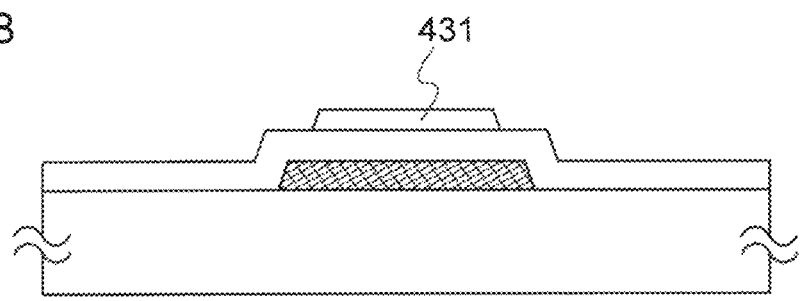

Then, the oxide semiconductor film 430 is selectively etched through a second photolithography process, so that an island-shaped oxide semiconductor layer 431 is formed (see FIG. 9B). The oxide semiconductor film 430 can be etched by wet etching. However, this embodiment is not limited to this. The oxide semiconductor film 430 may be etched by dry etching.

Then, first heat treatment is performed on the oxide semiconductor layer 431. Excessive water (including a hydroxyl group), hydrogen, or the like contained in the oxide semiconductor layer 431 can be removed by the first heat treatment. The temperature of the first heat treatment is higher than or equal to 350° C. and lower than the strain point of the substrate, preferably higher than or equal to 400° C. and lower than the strain point of the substrate.

The oxide semiconductor layer can be dehydrated or dehydrogenated when the first heat treatment is performed at a temperature of 350° C. or higher, so that the concentration of hydrogen in the oxide semiconductor layer can be lowered. When the first heat treatment is performed at a temperature of 450° C. or higher, the concentration of hydrogen in the oxide semiconductor layer can be further lowered. When the first heat treatment is performed at a temperature of 550° C. or higher, the concentration of hydrogen in the oxide semiconductor layer can be further lowered As the atmosphere in which the first heat treatment is performed, it is preferable to employ an inert gas that contains nitrogen or a rare gas (e.g., helium, neon, or argon) as a main component and does not contain water, hydrogen, or the like. For example, the purity of a gas introduced into a heat treatment apparatus can be 6N (99.9999%) or more, preferably 7N (99.99999%) or more. Thus, during the first heat treatment, it is possible to prevent entry of water or hydrogen while the oxide semiconductor layer 431 is not exposed to the air.

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus with which heat treatment is performed using a high-temperature gas. An inert gas which does not react with an object to be processed by heat treatment, nitrogen or a rare gas (e.g., argon), is used as the gas.

In this embodiment, as the first heat treatment, heat treatment is performed at 650° C. for six minutes in a nitrogen atmosphere with the use of a GRTA apparatus.

In addition, the first heat treatment for the oxide semiconductor layer can be performed on the oxide semiconductor film 430 before being processed into the island-shaped oxide semiconductor layer. In that case, after the first heat treatment, the second photolithography process is performed.

The first heat treatment for the oxide semiconductor layer may be performed after a source electrode layer and a drain electrode layer are formed over the oxide semiconductor layer or after a protective insulating film is formed over the source electrode layer and the drain electrode layer.

Figure 9C:
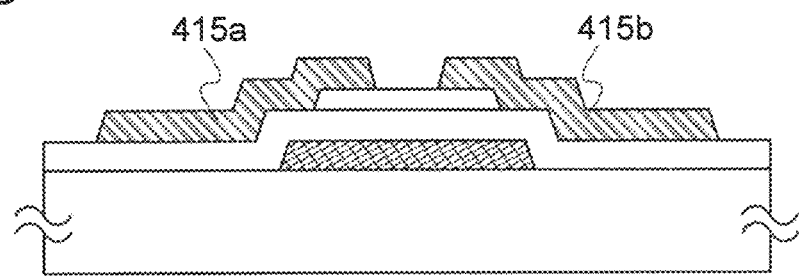

After that, a conductive layer is formed so as to cover the gate insulating layer 402 and the oxide semiconductor layer 431 and is etched through a third photolithography process, so that a source electrode layer 415a and a drain electrode layer 415b are formed (see FIG. 9C).

As the material of the conductive layer, an element selected from aluminum, chromium, copper, tantalum, titanium, molybdenum, or tungsten; an alloy containing the element as a component; or the like can be used. A material including aluminum and one or more elements selected from titanium, tantalum, tungsten, molybdenum, chromium, neodymium, and scandium may be used. A material selected from manganese, magnesium, zirconium, beryllium, or yttrium may be used. Alternatively, a material including aluminum and one or more elements selected from titanium, tantalum, tungsten, molybdenum, chromium, neodymium, or scandium may be used.

Alternatively, the conductive layer may be formed using an oxide conductive film. As the oxide conductive film, indium oxide ($In_2O_3$), tin oxide ($SnO_2$), zinc oxide (ZnO), an alloy of indium oxide and tin oxide ($In_2O_3$—$SnO_2$, which is abbreviated as ITO in some cases), an alloy of indium oxide and zinc oxide ($In_2O_3$—ZnO), or any of these oxide conductive materials including silicon or silicon oxide can be used.

In that case, a material whose conductivity is higher or whose resistivity is lower than a material used for the oxide semiconductor layer 431 is preferably used as the material of the oxide conductive film. The conductivity of the oxide conductive film can be increased by the increase in carrier concentration. Further, the carrier concentration in the oxide conductive film can be increased by the increase in hydrogen concentration or the increase in oxygen deficiency.

The source electrode layer 415a and the drain electrode layer 415b may have a single-layer structure or a layered structure including two or more layers.

In this embodiment, a 100-nm-thick first titanium layer, a 200-nm-thick aluminum layer, and a 100-nm-thick second titanium layer are sequentially formed over the oxide semiconductor layer 431. Then, a stack film including the first titanium layer, the aluminum layer, and the second titanium layer is etched, so that the source electrode layer 415a and the drain electrode layer 415b are formed (see FIG. 9C).

In the case where heat treatment is performed after the formation of the conductive layer, a conductive layer which has heat resistance high enough to withstand the heat treatment is used.

Note that each material and etching conditions are adjusted as appropriate so that the oxide semiconductor layer 431 is not removed when the conductive layer is etched.

Note that through the third photolithography process, only part of the oxide semiconductor layer 431 is etched, so that an oxide semiconductor layer having a groove (a depression) is formed in some cases.

In order to reduce the number of photomasks used in the photolithography processes and the number of processes, an etching process may be performed using a multi-tone mask which is an exposure mask through which light is transmitted to have a plurality of intensities. A resist mask formed using a multi-tone mask has a plurality of thicknesses and can be changed in shape by ashing; thus, the resist mask can be used in a plurality of etching processes for processing films into different patterns. Therefore, a resist mask corresponding to at least two or more kinds of different patterns can be formed by one multi-tone mask. Thus, the number of exposure masks and the number of corresponding photolithography processes can be reduced, so that the process can be simplified.

Next, plasma treatment is performed using a gas such as nitrous oxide ($N_2O$), nitrogen ($N_2$), or argon (Ar). With this plasma treatment, absorbed water and the like which attach to a surface of the oxide semiconductor layer exposed are removed. Alternatively, plasma treatment may be performed using a mixture gas of oxygen and argon.

Figure 9D:
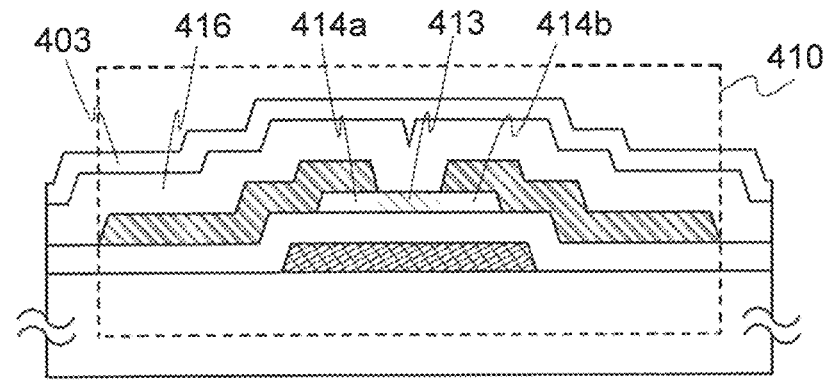
Figure 10:
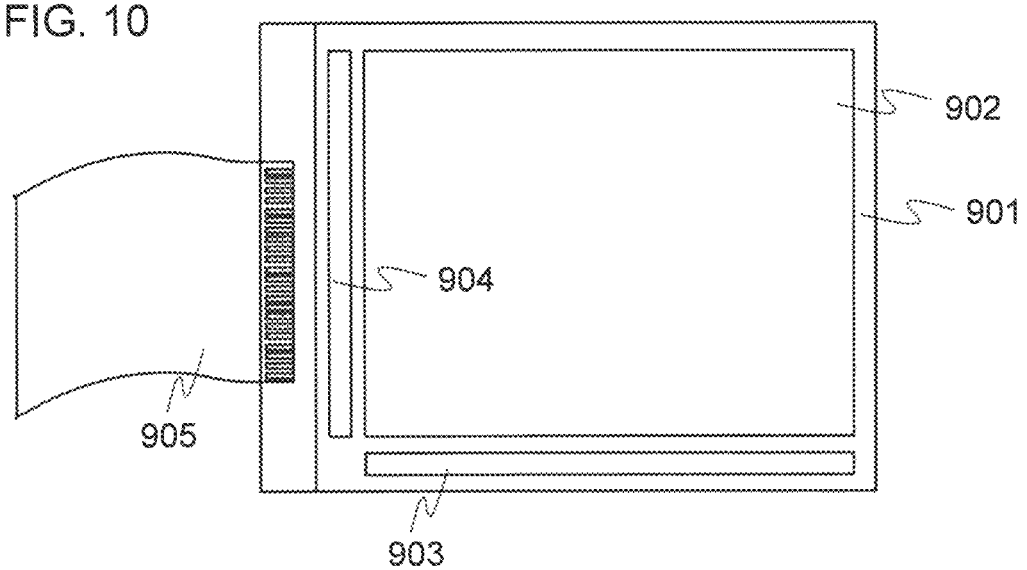
FIG. 10 is an example of a top view of a semiconductor device.

After the plasma treatment, an oxide insulating layer 416 which serves as a protective insulating film and is in contact with part of the oxide semiconductor layer is formed without exposure to the air (see FIG. 9D).

The oxide insulating layer 416 can be formed by a method by which an impurity such as water or hydrogen is not mixed, such as sputtering. The thickness of the oxide insulating layer 416 can be at least 1 nm or more. When hydrogen is contained in the oxide insulating layer 416, hydrogen enters the oxide semiconductor layer 431, so that a backchannel of the oxide semiconductor layer 431 has lower resistance (has n-type conductivity) and a parasitic channel might be formed. Therefore, it is important that a deposition method in which hydrogen is not used be employed in order that the oxide insulating layer 416 contain as little hydrogen as possible.

The substrate temperature at the time of deposition is in the range of from room temperature to 300° C. Further, a deposition atmosphere can be a rare gas (typically argon) atmosphere, an oxygen atmosphere, or an atmosphere including a rare gas (typically argon) and oxygen.

In this embodiment, the substrate is heated at a temperature of 200° C. before the formation of the oxide insulating layer 416, and a 300-nm-thick silicon oxide film is formed as the oxide insulating layer 416 so as to cover the source electrode layer 415a and the drain electrode layer 415b. The silicon oxide film is formed using a silicon target by sputtering in which oxygen is used as a sputtering gas.

Then, second heat treatment (preferably at 200 to 400° C., for example, 250 to 350° C.) is performed in an inert gas atmosphere or an oxygen gas atmosphere. For example, the second heat treatment is performed at 250° C. for one hour in a nitrogen atmosphere. Through the second heat treatment, part of the oxide semiconductor layer (a channel formation region) is heated while being in contact with the oxide insulating layer 416. By the second heat treatment, oxygen can be supplied to the part of the oxide semiconductor layer (the channel formation region). Thus, a channel formation region 413 which overlaps with the gate electrode layer 411 can be intrinsic. A source region 414a which overlaps with the source electrode layer 415a and a drain region 414b which overlaps with the drain electrode layer 415b are formed in a self-aligning manner. Through the steps, the transistor 410 is formed.

A protective insulating layer may be formed over the oxide insulating layer 416. For example, a silicon nitride film can be formed by RF sputtering. Since RF sputtering has high productivity, it is preferably used as a deposition method of the protective insulating layer. The protective insulating layer is preferably formed using an inorganic insulating film which does not contain an impurity such as moisture, a hydrogen ion, and OH⁻ and blocks entry of such an impurity from the outside. In this embodiment, as the protective insulating layer, a protective insulating layer 403 is formed using a silicon nitride film (see FIG. 9D).

Further, heat treatment may be performed at 100 to 200° C. for 1 to 30 hours in an air atmosphere. Here, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a certain temperature of 100 to 200° C. and then decreased to room temperature. Further, this heat treatment may be performed under a reduced pressure before the formation of the oxide insulating layer. When the heat treatment is performed under a reduced pressure, the heating time can be shortened. Through this heat treatment, hydrogen is introduced from the oxide semiconductor layer 431 to the oxide insulating layer 416. That is, hydrogen can be further removed from the oxide semiconductor layer.

A bias temperature test (BT test) is performed on the transistor 410 at 85° C. and $2\times10^6$ V/cm for 12 hours. As a result, the electrical characteristics of the transistor hardly changed and a transistor with stable electrical characteristics was able to be obtained.

The transistor including an oxide semiconductor in this embodiment has an electrical characteristic of much lower off-state current than a transistor including silicon or the like. Therefore, when the transistor including an oxide semiconductor in this embodiment is used as a transistor in a pixel portion, an image signal written to a display element can be held for a long period without a change in the circuit structure or the like of the pixel. Accordingly, in the case where still images or the like is displayed, write frequency can be lowered. Thus, power consumption can be reduced.

With the transistor, an image signal written to the display element can be held for a long period. Accordingly, even in the case where write frequency is low, degradation (change) in display of the pixel can be suppressed.

A substrate including the transistor in this embodiment can be used as the substrate 301 illustrated in FIG. 1, FIGS. 2A to 2E, FIGS. 3A and 3B, FIG. 4, and FIG. 6. That is, the substrate 601 illustrated in FIGS. 2A to 2E and FIGS. 3A and 3B can be attached to the substrate including the transistor in this embodiment.

This embodiment can be combined with any of the other embodiments and the examples as appropriate.

Example 1

In this example, the evaluation of a transistor in a pixel portion included in a semiconductor device which is one embodiment of the disclosed invention is described with reference to FIG. 11, FIGS. 12A and 12B, and FIGS. 13A and 13B. In this example, measured values of off-state current in a test element group (also referred to as TEG) are described below.

Figure 11:
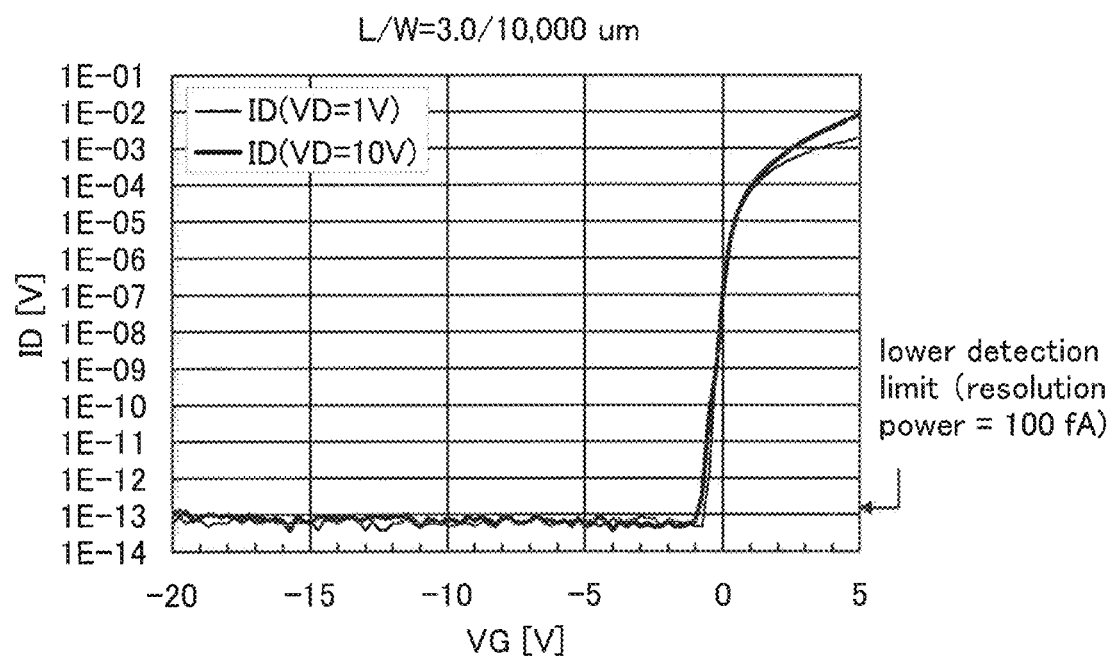
FIG. 11 illustrates examples of $V_g$-$I_d$ characteristics of a test element group of a transistor included in a semiconductor device.
Figure 12A:
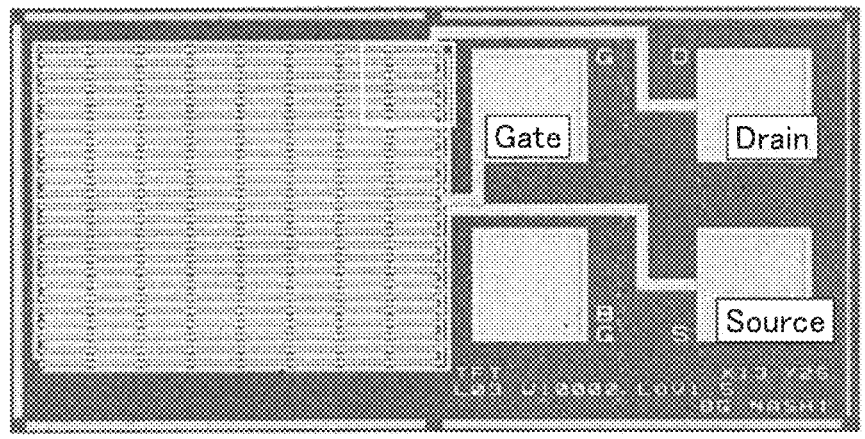
FIGS. 12A and 12B are examples of top views of the test element group of the transistor included in the semiconductor device.
Figure 12B:
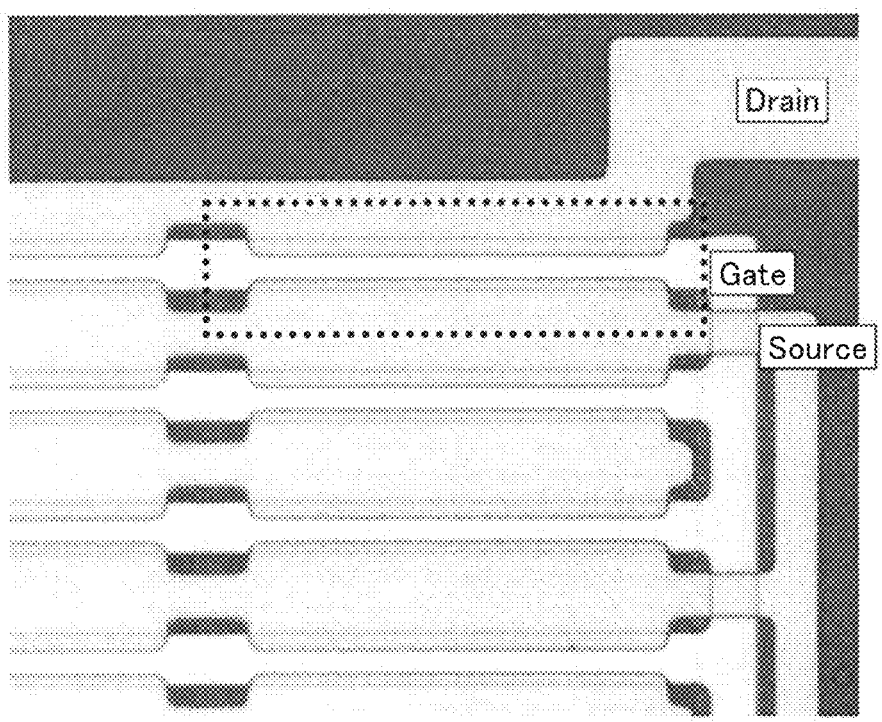

FIG. 11 illustrates the initial characteristics of a transistor with L/W=3 μm/10000 μm in which 200 transistors with L/W=3 μm/50 μm each are connected in parallel. The transistor includes a high-purity oxide semiconductor layer in a channel formation region. In addition, the top view of the transistor is illustrated in FIG. 12A and a partly enlarged top view thereof is illustrated in FIG. 12B. The region enclosed by a dotted line in FIG. 12B is a transistor of one stage with L/W=3 μm/50 μm and $L_{ov}$=1.5 μm. Note that here, $L_{ov}$ represents the length of a region where a source electrode layer or a drain electrode layer overlaps with an oxide semiconductor layer in a channel length direction. In order to measure the initial characteristics of the transistor, a change in characteristics of source-drain current (hereinafter referred to as drain current or $I_d$) when source—gate voltage (hereinafter referred to as gate voltage or $V_g$) is changed, i.e., $V_g$-$I_d$ characteristics were measured under condition that the substrate temperature was room temperature, source-drain voltage (hereinafter referred to as drain voltage or $V_d$) was 1 V or 10 V, and $V_g$ was changed from −20 to +20 V. Note that FIG. 11 illustrates $V_g$ in the range of from −20 to +5 V.

As illustrated in FIG. 11, the transistor with a channel width W of 10000 μm has an off-state current of $1\times10^{-13}$ A or less at $V_d$ of 1 V and 10 V, which is less than or equal to the detection limit of a measurement device (a semiconductor parameter analyzer, Agilent 4156C manufactured by Agilent Technologies Inc.). That is, it is confirmed that the off-state current of the transistor per micrometer in channel width is 10 aA/μm or less. Note that in the case where the channel length is 3 μm or more, the estimated off-state current of the transistor per micrometer in channel width is 10 aA/μm or less.

Further, a transistor whose channel width W is 1000000 μm (1 m) was formed similarly and measurement was conducted. As a result, it was confirmed that the off-state current is $1\times10^{-12}$ A or less, which is close to the detection limit of the measurement device. That is, it was confirmed that the off-state current of the transistor per micrometer in channel width is 1 aA/μm or less.

A method for manufacturing the transistor used for the measurement is described.

First, as a base layer, by CVD, a silicon nitride layer was formed over a glass substrate and a silicon oxynitride layer was formed over the silicon nitride layer. Over the silicon oxynitride layer, a tungsten layer was formed as a gate electrode layer by sputtering. Here, the tungsten layer was selectively etched so that the gate electrode layer was formed.

Next, over the gate electrode layer, a 100-nm-thick silicon oxynitride layer was formed as a gate insulating layer by CVD.

Then, a 50-nm-thick oxide semiconductor layer was formed over the gate insulating layer by sputtering with the use of an In—Ga—Zn—O-based metal oxide target ($In_2O_3$:$Ga_2O_3$:ZnO=1:1:2 in a molar ratio). After that, an island-shaped oxide semiconductor layer was formed by selective etching of the oxide semiconductor layer.

Then, first heat treatment was performed on the oxide semiconductor layer in a clean oven at 450° C. for one hour in a nitrogen atmosphere.

Then, as a source electrode layer and a drain electrode layer, a 150-nm-thick titanium layer was formed over the oxide semiconductor layer by sputtering. Here, the source electrode layer and the drain electrode layer were selectively etched, and 200 transistors each having a channel length L of 3 μm and a channel width W of 50 μm were connected in parallel so that a transistor with L/W=3 μm/10000 μm is obtained.

Then, as a protective insulating layer, a 300-nm-thick silicon oxide layer was formed so as to be in contact with the oxide semiconductor layer by reactive sputtering. Here, the silicon oxide which is a protective layer was selectively etched so that openings were formed over the gate electrode layer, the source electrode layer, and the drain electrode layer. After that, second heat treatment was performed at 250° C. for one hour in a nitrogen atmosphere.

Then, heat treatment was performed at 150° C. for 10 hours before the measurement of $V_g$-$I_d$ characteristics.

Through the steps, a bottom-gate transistor was manufactured.

The reason why the off-state current of the transistor is approximately $1 \times 10^{-13}$ A as illustrated in FIG. 11 is that the concentration of hydrogen in the oxide semiconductor layer can be sufficiently reduced in the manufacturing steps.

The carrier concentration in the oxide semiconductor layer that is measured by a carrier measurement device is lower than $1 \times 10^{12}$/cm$^3$, preferably lower than $1 \times 10^{11}$/cm$^3$. That is, the carrier concentration in the oxide semiconductor layer can be extremely close to zero.

Further, the channel length L of the transistor can be 10 to 1000 nm. Thus, a circuit can operate at higher speed. Furthermore, since the amount of off-state current is extremely small, power consumption can be reduced.

In circuit design, the oxide semiconductor layer can be regarded as an insulator when the transistor is off.

After that, the temperature characteristics of off-state current of the transistor manufactured in this example were evaluated. The temperature characteristics are important in considering the environmental resistance, maintenance of performance, or the like of an end product in which the transistor is used. It is to be understood that a smaller amount of change is preferable, which increases the degree of freedom for product design.

For the temperature characteristics, the $V_g$-$I_d$ characteristics were obtained using a constant-temperature chamber under conditions that substrates provided with transistors were kept at constant temperatures of −30° C., 0° C., 25° C., 40° C., 60° C., 80° C., 100° C., and 120° C., drain voltage was 6 V, and gate voltage was changed from −20 to +20 V.

Figure 13A:
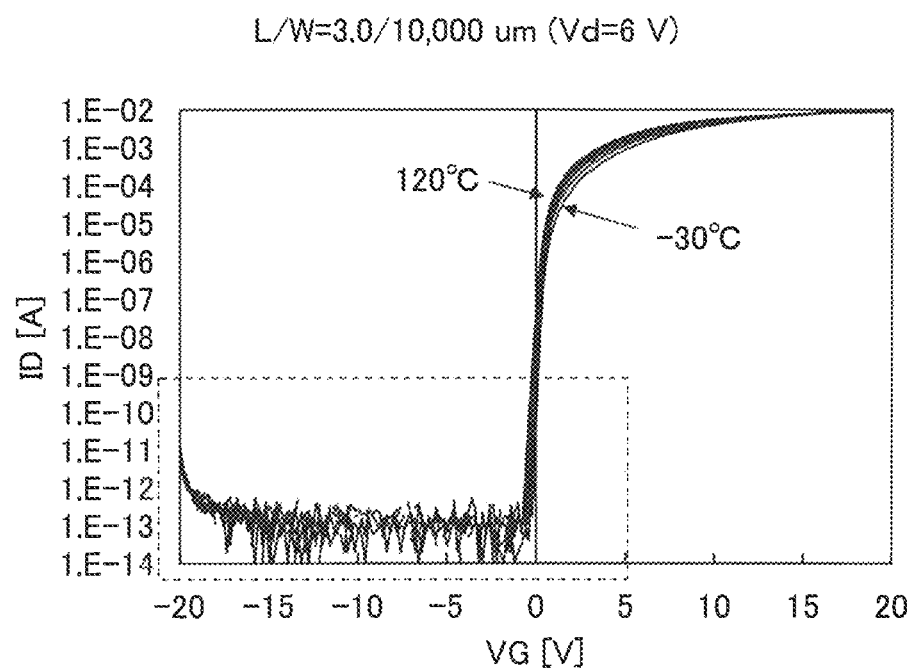
FIGS. 13A and 13B are examples of $V_g$-$I_d$ characteristics of the test element group of the transistor included in the semiconductor device.
Figure 13B:
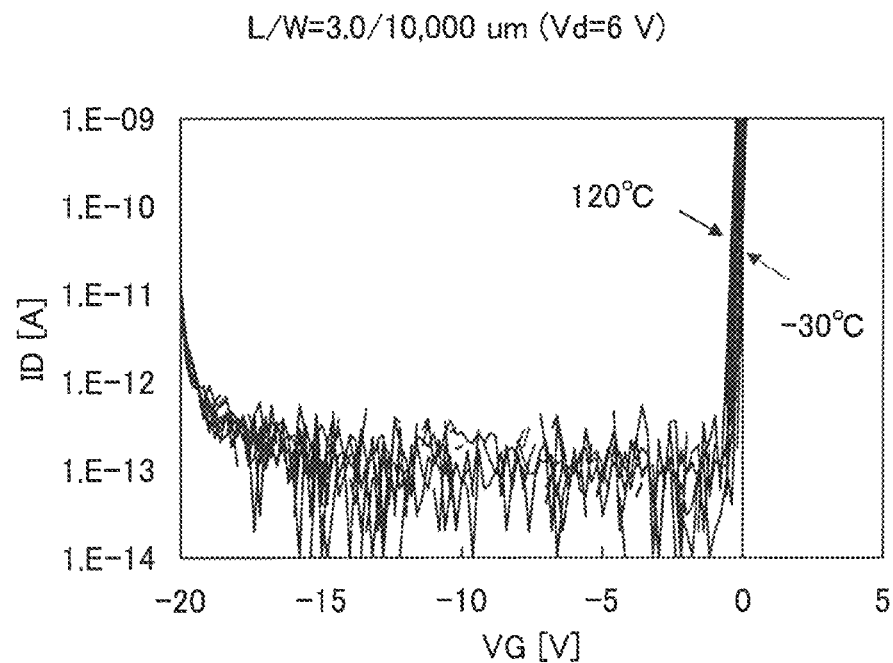

FIG. 13A illustrates $V_g$-$I_d$ characteristics measured at the temperatures and superimposed on one another, and FIG. 13B illustrates an enlarged view of the range of off-state current enclosed by a dotted line in FIG. 13A. The rightmost curve indicated by an arrow in the diagram is a curve obtained at −30° C.; the leftmost curve is a curve obtained at 120° C.; and curves obtained at the other temperatures are located therebetween. The temperature dependence of on-state current can hardly be observed. On the other hand, as clearly illustrated also in the enlarged view of FIG. 13B, the off-state current is $1 \times 10^{-12}$ A or less, which is near the detection limit of the measurement device, at all the temperatures except the case where the gate voltage is around −20 V, and the temperature dependence thereof is not observed. In other words, even at a high temperature of 120° C., the off-state current is kept at $1 \times 10^{-12}$ A or less, and given that the channel width W is 10000 μm, it can be seen that the off-state current is significantly low. That is, it is confirmed that the off-state current of the transistor per micrometer in channel width is 100 aA/μm or less. Note that in the case where the channel length is 3 μm or more, the estimated off-state current of the transistor per micrometer in channel width is 100 aA/μm or less.

As described above, a transistor including a high-purity oxide semiconductor shows almost no dependence of off-state current on temperature. It can be said that an oxide semiconductor does not show temperature dependence when highly purified because the conductivity type becomes extremely close to an intrinsic type and the Fermi level is located in the middle of the forbidden band. This also results from the fact that the oxide semiconductor has a large energy gap and includes very few thermally excited carriers.

The results show that the off-state current of a transistor whose carrier density is lower than $1 \times 10^{12}$/cm$^3$, preferably lower than $1 \times 10^{11}$/cm$^3$ at room temperature is 1 aA/μm or lower. In addition, when the transistor is used as a transistor included in a semiconductor device, the power consumption of the semiconductor device can be reduced and degradation in display (the decrease in display quality) can be suppressed. Further, it is possible to provide a semiconductor device where degradation (change) in display due to an external factor such as temperature is suppressed.

Therefore, when a transistor including a high-purity oxide semiconductor is used as a transistor in a pixel portion as described above, an image signal written to a display element can be held for a long period without a change in the circuit structure or the like of the pixel. Accordingly, in the case where still images or the like is displayed, write frequency can be lowered. Thus, power consumption can be reduced.

When the high-purity transistor is used as described above, an image signal written to the display element can be held for a long period. Accordingly, even in the case where write frequency is low, degradation (change) in display of the pixel can be suppressed.

As described above, a substrate including the high-purity transistor can be used as the substrate 301 illustrated in FIG. 1, FIGS. 2A to 2E, FIGS. 3A and 3B, FIG. 4, and FIG. 6. That is, as described above, the substrate 601 illustrated in FIGS. 2A to 2E and FIGS. 3A and 3B can be attached to the substrate including the high-purity transistor.

Example 2

Figure 14:
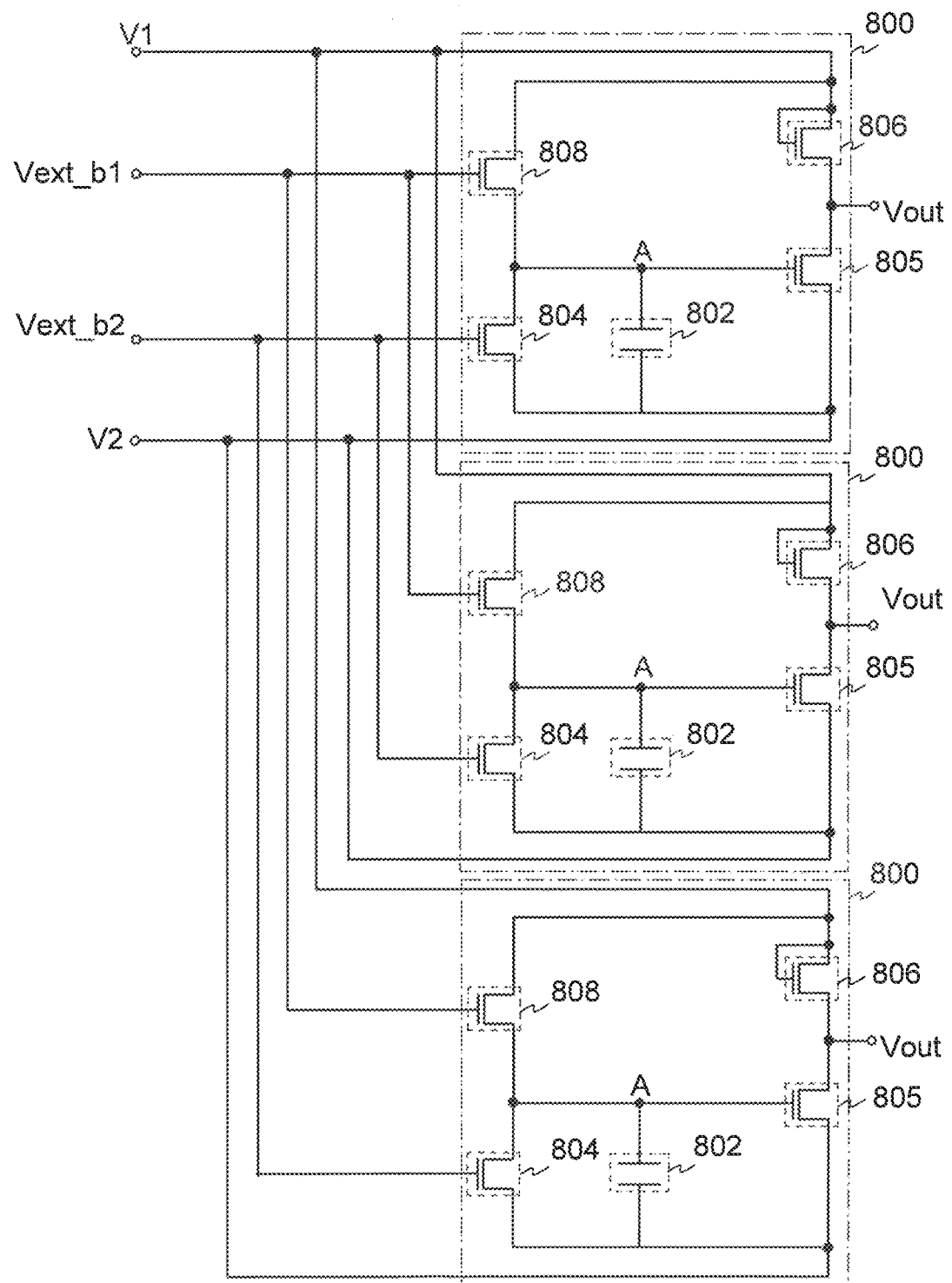
FIG. 14 is an example of a diagram illustrating a circuit for evaluating characteristics of the transistor included in the semiconductor device.

In this example, the evaluation of a transistor in a pixel portion included in a semiconductor device which is one embodiment of the disclosed invention is described with reference to FIG. 14, FIG. 15, and FIG. 16. In this example, the off-state current of a transistor including a high-purity oxide semiconductor is accurately obtained, and results thereof are shown.

First, a test element group used in a method for measuring current is described with reference to FIG. 14. In the test element group in FIG. 14, three measurement systems 800 are connected in parallel. The measurement system 800 includes a capacitor 802, a transistor 804, a transistor 805, a transistor 806, and a transistor 808. The transistor 804, the transistor 805, and the transistor 806 are formed in accordance with the manufacturing method illustrated in FIGS. 9A to 9D and have a structure which is similar to that of FIG. 9D.

In the measurement system 800, one of a source terminal and a drain terminal of the transistor 804, one terminal of the capacitor 802, and one of a source terminal and a drain terminal of the transistor 805 are connected to a power source (a power source for supplying V2). The other of the source terminal and the drain terminal of the transistor 804, one of a source terminal and a drain terminal of the transistor 808, the other terminal of the capacitor 802, and a gate terminal of the transistor 805 are connected to each other. The other of the source terminal and the drain terminal of the transistor 808, one of a source terminal and a drain terminal of the transistor 806, and a gate terminal of the transistor 806 are connected to a power source (a power source for supplying V1). The other of the source terminal and the drain terminal of the transistor 805 and the other of the source terminal and the drain terminal of the transistor 806 are connected to each other and serve as an output terminal $V_{out}$.

A potential $V_{ext\_b2}$ for controlling on/off of the transistor 804 is supplied to a gate terminal of the transistor 804. A potential $V_{ext\_b1}$ for controlling on/off of the transistor 808 is supplied to a gate terminal of the transistor 808. Further, a potential $V_{out}$ is output from the output terminal.

Next, a method for measuring off-state current with the measurement system is described.

First, an initial period in which a potential difference is generated in order to measure off-state current is described. In the initial period, the potential $V_{ext\_b1}$ for turning on the transistor 808 is input to the gate terminal of the transistor 808, and the potential V1 is supplied to a node A connected to the other of the source terminal and the drain terminal of the transistor 804 (i.e., a node connected to the one of the source terminal and the drain terminal of the transistor 808, the other terminal of the capacitor 802, and a gate terminal of the transistor 805). Here, the potential V1 is, for example, a high potential. Further, the transistor 804 is off.

After that, the potential $V_{ext\_b1}$ for turning off the transistor 808 is input to the gate terminal of the transistor 808 so that the transistor 808 is turned off. After the transistor 808 is turned off, the potential V1 is set low. The transistor 804 is kept off. Further, the potential V2 is set low. Thus, the initial period is finished.

Next, a measurement period of the off-state current is described. In the measurement period, the potential (i.e., V2) of the one of the source terminal and the drain terminal of the transistor 804 and the potential (i.e., V1) of the other of the source terminal and the drain terminal of the transistor 808 are fixed low. On the other hand, the potential of the node A is not fixed (the node A is in a floating state) in the measurement period. Accordingly, electrical charges flow through the transistor 804, and the amount of electrical charges stored in the node A is changed as time passes. The potential of the node A is changed depending on the change in the amount of electrical charges stored in the node A. That is, the output potential Vout of the output terminal is also changed. The off-state current can be calculated from the thus obtained output potential Vout.

Each of the transistor 804, the transistor 805, the transistor 806, and the transistor 808 is a transistor including a high-purity oxide semiconductor with a channel length L of 10 μm and a channel width W of 50 μm. In the three measurement systems 800 connected in parallel, the capacitance value of the capacitor 802 in a first measurement system is 100 fF; the capacitance value of the capacitor 802 in a second measurement system is 1 pF; and the capacitance value of the capacitor 802 in a third measurement system is 3 pF.

Note that $V_{DD}$ was 5 V and $V_{SS}$ was 0 V in the measurement of off-state current. In the measurement period, the potential V1 was basically $V_{SS}$ and $V_{DD}$ only in a period of 100 msec every 10 to 300 seconds, and $V_{out}$ was measured. Further, time taken to calculate current I flowing through an element was about 30000 seconds.

Figure 15:
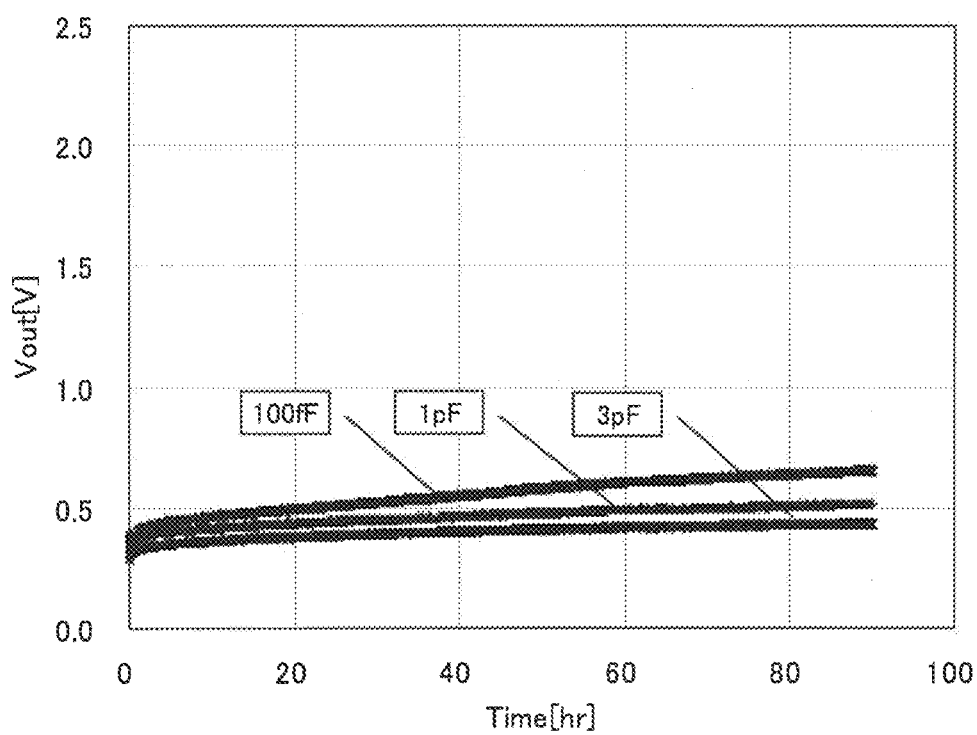
FIG. 15 illustrates examples of the characteristics of the transistor included in the semiconductor device.

FIG. 15 shows the relationship between elapsed time Time in measurement of the current and the output potential $V_{out}$. FIG. 15 shows that the potential varies as time passes.

Figure 16:
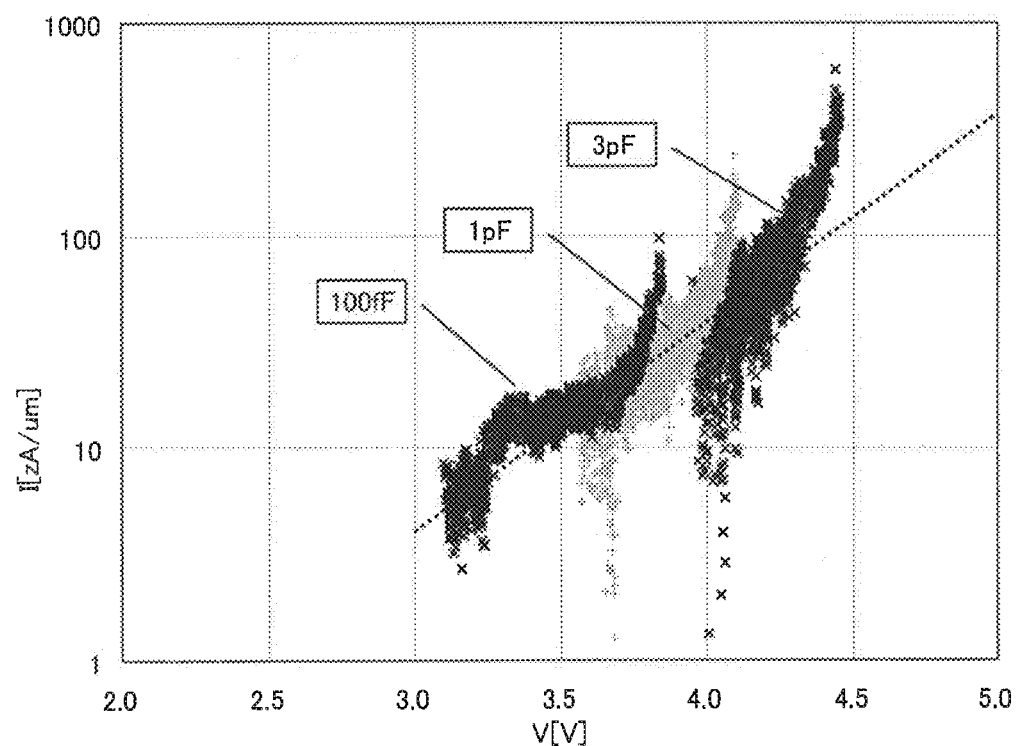
FIG. 16 illustrates examples of the characteristics of the transistor included in the semiconductor device.

FIG. 16 shows off-state current calculated in the measurement of the current. Note that FIG. 16 shows the relationship between source-drain voltage V and off-state current I. FIG. 16 shows that off-state current is about 40 zA/μm under the condition that the source-drain voltage is 4 V. In addition, the off-state current is less than or equal to 10 zA/μm under the condition that the source-drain voltage is 3.1 V. Note that 1 zA represents $10^{-21}$ A.

According to this example, it is confirmed that the off-state current can be sufficiently low in a transistor including a high-purity oxide semiconductor.

When a transistor including a high-purity oxide semiconductor is used as a transistor in a pixel portion as described above, an image signal written to a display element can be held for a long period without a change in the circuit structure or the like of the pixel. Accordingly, in the case where still images or the like is displayed, write frequency can be lowered. Thus, power consumption can be reduced.

When the high-purity transistor is used as described above, an image signal written to the display element can be held for a long period. Accordingly, even in the case where write frequency is low, degradation (change) in display of the pixel can be suppressed.

As described above, a substrate including the high-purity transistor can be used as the substrate 301 illustrated in FIG. 1, FIGS. 2A to 2E, FIGS. 3A and 3B, FIG. 4, and FIG. 6. That is, as described above, the substrate 601 illustrated in FIGS. 2A to 2E and FIGS. 3A and 3B can be attached to the substrate including the high-purity transistor.

This application is based on Japanese Patent Application Serial No. 2010-019602 filed with Japan Patent Office on Jan. 29, 2010, the entire contents of which are hereby incorporated by reference.

The invention claimed is:

1. A semiconductor device comprising:
  a first substrate having a first region and a second region;
  a second substrate overlapped with the first region of the first substrate; and
  a third substrate overlapping with the second region of the first substrate,
  wherein the first region of the first substrate has a first receiver antenna,
  wherein the second region of the first substrate has a pixel portion including a plurality of pixels,
  wherein the second substrate has a first transmitter antenna, and
  wherein the first transmitter antenna is fixed to the first region of the first substrate so as to be overlapped with the first receiver antenna with the first region of the first substrate positioned therebetween.

2. The semiconductor device according to claim 1, wherein the third substrate does not overlap the second substrate.

3. The semiconductor device according to claim 1, wherein each of the first substrate, the second substrate, and the third substrate is flexible.

4. The semiconductor device according to claim 1, wherein the first receiver antenna is configured to receive an image signal to be input to the pixel portion, and the first transmitter antenna is configured to transmit the image signal.

5. The semiconductor device according to claim 1, wherein the second substrate is attached to the first region of the first substrate with an adhesive.

6. The semiconductor device according to claim 1, further comprising a signal processing portion and a power source portion provided on the first region of the first substrate.

7. The semiconductor device according to claim 1, further comprising an integrated circuit provided on the second substrate.

8. The semiconductor device according to claim 1, wherein each of the plurality of pixels includes a liquid crystal element.

9. The semiconductor device according to claim 1, wherein each of the plurality of pixels includes a light emitting element.

10. The semiconductor device according to claim 1, wherein each of the plurality of pixels includes an electrophoretic element.

11. A semiconductor device comprising:
a first substrate having a first region and a second region;
a second substrate overlapped with the first region of the first substrate; and
a third substrate overlapping with the second region of the first substrate,
wherein the first region of the first substrate has a first receiver antenna and a second receiver antenna,
wherein the second region of the first substrate has a pixel portion including a plurality of pixels,
wherein the second substrate has a first transmitter antenna and a second transmitter antenna, and
wherein the first transmitter antenna and the second transmitter antenna are fixed to the first region of the first substrate so as to be overlapped with the first receiver antenna and the second receiver antenna with the first region of the first substrate positioned therebetween.

12. The semiconductor device according to claim 11, wherein the third substrate does not overlap the second substrate.

13. The semiconductor device according to claim 11, wherein each of the first substrate, the second substrate, and the third substrate is flexible.

14. The semiconductor device according to claim 11, wherein the first receiver antenna is configured to receive an image signal to be input to the pixel portion, and the first transmitter antenna is configured to transmit the image signal.

15. The semiconductor device according to claim 11, wherein the second receiver antenna and the second transmitter antenna are power antennas.

16. The semiconductor device according to claim 11, wherein the second substrate is attached to the first region of the first substrate with an adhesive.

17. The semiconductor device according to claim 11, further comprising a signal processing portion and a power source portion provided on the first region of the first substrate.

18. The semiconductor device according to claim 11, further comprising an integrated circuit electrically connected to each of the first transmitter antenna and the second transmitter antenna.

19. The semiconductor device according to claim 11, wherein each of the plurality of pixels includes a liquid crystal element.

20. The semiconductor device according to claim 11, wherein each of the plurality of pixels includes a light emitting element.

21. The semiconductor device according to claim 11, wherein each of the plurality of pixels includes an electrophoretic element.

* * * * *